United States Patent
Yoshida

(10) Patent No.: US 7,451,376 B2
(45) Date of Patent: *Nov. 11, 2008

(54) DECODER AND DECODING METHOD FOR DECODING IRREGULAR LOW-DENSITY PARITY-CHECK CODES

(75) Inventor: Kenji Yoshida, Akishima (JP)

(73) Assignee: Kabushiki Kaisha Toshiba

( * ) Notice: Subject to any disclaimer, the term of this patent is extended or adjusted under 35 U.S.C. 154(b) by 100 days.

This patent is subject to a terminal disclaimer.

(21) Appl. No.: 11/417,022

(22) Filed: May 4, 2006

(65) Prior Publication Data

US 2006/0271616 A1 Nov. 30, 2006

(30) Foreign Application Priority Data

May 31, 2005 (JP) ............... 2005-159469

(51) Int. Cl.
*H03M 13/00* (2006.01)
(52) U.S. Cl. ...................... 714/752; 714/786
(58) Field of Classification Search ................ 714/752, 714/758, 799, 786
See application file for complete search history.

(56) References Cited

U.S. PATENT DOCUMENTS

| 7,178,081 | B2* | 2/2007 | Lee et al. ............ 714/752 |
| 7,178,880 | B2* | 2/2007 | Andersen ............ 301/35.627 |
| 7,181,676 | B2* | 2/2007 | Hocevar ............ 714/780 |
| 2003/0033575 | A1 | 2/2003 | Richardson et al. |
| 2005/0229087 | A1* | 10/2005 | Kim et al. ............ 714/800 |
| 2006/0036925 | A1* | 2/2006 | Kyung et al. ............ 714/758 |

FOREIGN PATENT DOCUMENTS

| JP | 2004-364233 | 12/2004 |
| JP | 2005-045735 | 2/2005 |

OTHER PUBLICATIONS

European Search Report dated Sep. 13, 2006 for Appln. No. 06113093.6-2223.
Yanni Chen et al: "A FPGA and ASIC implementation of rate ½, 8088-b irregular law density parity check decoder" Globecom'03. 2003—IEEE Global Telecommunications Conference. Conference Proceedings. San Francisco, Dec. 1-5, 2003, IEEE Global Telecommunications Conference, New York, NY : IEEE, US, vol. vol. 7 of 7, Dec. 1, 2003, pp. 113-117, XP010677856.

(Continued)

*Primary Examiner*—Esaw Abraham
(74) *Attorney, Agent, or Firm*—Pillsbury Winthrop Shaw Pittman, LLP

(57) ABSTRACT

In one embodiment, bit processing units are provided for the $1^{st}$ to $M^{th}$ rows (M=p1×m1) of a parity-check matrix that includes a first parity-check matrix and second parity-check matrix adjacent thereto. The first and second parity-check matrices include (n1×m1) and (n2×m2) permuted matrices, respectively. The bit processing units sequentially update bit information corresponding to column positions included in the respective rows of the first and second parity-check matrices, a bit at each of the column positions being set to "1". Parity processing units update parity information corresponding to row positions in p1 columns of each of the n1 column blocks of the first parity-check matrix, and corresponding to row positions in p2 columns of each of the n2 column blocks of the second parity-check matrix, a bit at each of the row positions being set to "1".

17 Claims, 7 Drawing Sheets

OTHER PUBLICATIONS

C. Hansen and B. Edwards : "WWise Proposal: High throughput extension to the 802.11 Standard" IEEE P802.11 Wireless Lans, Jan. 25, 2005, pp. 1-100, XP002397072.

Lynch R; Kurtas E M; Kuznetsov A; Engling Yeo; Nikolic B: "The search for a practical iterative detector for magnet recording" IEEE Transactions on Magnetics, vol. 40, No. 1, Jan. 2004 (2004-011, pp. 213-218, XP002397073.

Karkooti M et al: "Semi-paralle reconfigurable architectures for real time LDPC decoding" Information Technology: Coding and Computing, 2004. Proceedings. ITCC 2604. International Conference on LA5 Vegas, NV, USA Apr. 5-7, 2004, Piscataway, NJ, USA, IEEE, Apr. 5, 2004, pp. 579-585, XP010696711.

Hocevar D E: "A Reduced Complexity Decoder Architecture via Layered Decoding of LDPC Codes" Signal Processing Systems, 2004. SIPS 2004, IEEE Workshop on Austin, Texas, USA Oct. 13-15, 2004, Piscataway, NJ, USA, IEEE, Oct. 13. 2004, pp. 107-1 12, XP010743944.

Murphy G et al: "Design and implementation of a parameterizable LDPC decoder IP core" Microelectronics, 2004. 24th International Conference on NIS, Serbia and Montenegro May 16-19, 2004, Piscataway, NJ, USA, IEEE, vol. 2, May 16, 2004, pp. 747-750, XP010708951.

Al-Raw1 G et al: "Optimizing iterative decoding of low-density parity check codes on programmable pipelined parallel architectures" Globecom'O1 . 2001 IEEE Global Telecommunications Conference . San Antonio, TX, Nov. 25-29, 2001, IEEE Global Telecommunications Conference, New York, NY : IEEE, US, vol. vol. 5 of 6, Nov. 25-26, 2001, pp. 3012-3018, XP010747546 ISBN.

F. Kienle, T. Brack, R. Wehn: "A synthesisable IP core for DVB-52 LDPC Code Decoding" Design, Automation and Test in Europe Conference, Mar. 21, 2005, pp. 100-105, XP002397074.

Mansour M M et al: "High-throughput LDPC decoders" IEEE Transactions on Very Large Scale Integration (VLSI) Systems, IEEE Service Center, Piscataway, NJ, US, vol. 11, No. 6, Dec. 2003, pp. 976-996, XP002302866.

Eroz M et al: "DVB-S2 low density parity check codes with near Shannon limit performance" Int . Journal of Satellite Communications and Networking, vol. 22, Jun. 16, 2004, pp. 269-279, XPO02374973.

Lei Yang et al: "An FPGA implementation of low-density parity-check code decoder with multi-rate capability" Design Automation Conference, 2005. Proceedings of the ASP-DAC 2005. Asia and South Pacific Shanghai, China Jan. 18-21, 2005, Piscataway, NJ, USA, IEEE, Jan. 18, 2005, pp. 760-763, XP010814461 ISBN.

Blanksby A J et al: A 690-MW 1-GB/S 1024-8, Rate-½ Low-Density Parity-Check Code Decodert1 IEEE Journal of Solid-State Circuits, IEEE Service Center, Piscataway, NJ, US, vol. 37, No. 3, Mar. 2002, pp. 404-412, XP001222671.

Andrew J. Blanksby et al.; "A 690-mW 1-Gb/s 1024-b, Rate-½ Low-Density Parity-Check Code Decoder", IEEE Journal of Solid-State Circuits, vol. 37, No. 3, pp. 404-412, Mar. 2002.

* cited by examiner

| Cycle | HCALC | | | VCALC | | |
|---|---|---|---|---|---|---|
| | Input(Add) | Input(Sub) | Output | Input | Output | |
| 1 | Q1,1, Q2,1, Q3,1 | - | - | - | - | |
| 2 | Q1,2, Q2,2, Q3,2 | | - | - | - | |
| 3 | Q1,3, Q2,3, Q3,3 | | - | - | - | |
| 4 | Q1,4, Q2,4, Q3,4 | | - | - | - | |
| 5 | Q1,5, Q2,5, Q3,5 | | - | - | - | |
| 6 | Q1,6, Q2,6, Q3,6, Q4,6, Q5,6 | | - | - | - | |
| 7 | Q1,7, Q2,7, Q3,7, Q4,7, Q5,7 | | - | - | - | |
| 8 | Q1,8, Q2,8, Q3,8, Q4,8, Q5,8 | | - | - | - | |
| 9 | - | Q1,1, Q2,1, Q3,1 | R1,1, R2,1, R3,1 | - | - | |
| 10 | Q'1,1, Q'2,1, Q'3,1 | Q1,2, Q2,2, Q3,2 | R1,2, R2,2, R3,2 | R1,1, R2,1, R3,1 | Q'1,1, Q'2,1, Q'3,1 | |
| 11 | Q'1,2, Q'2,2, Q'3,2 | Q1,3, Q2,3, Q3,3 | R1,3, R2,3, R3,3 | R1,2, R2,2, R3,2 | Q'1,2, Q'2,2, Q'3,2 | |
| 12 | Q'1,3, Q'2,3, Q'3,3 | Q1,4, Q2,4, Q3,4 | R1,4, R2,4, R3,4 | R1,3, R2,3, R3,3 | Q'1,3, Q'2,3, Q'3,3 | |
| 13 | Q'1,4, Q'2,4, Q'3,4 | Q1,5, Q2,5, Q3,5 | R1,5, R2,5, R3,5 | R1,4, R2,4, R3,4 | Q'1,4, Q'2,4, Q'3,4 | |
| 14 | Q'1,5, Q'2,5, Q'3,5 | Q1,6, Q2,6, Q3,6, Q4,6, Q5,6 | R1,6, R2,6, R3,6, R4,6, R5,6 | R1,5, R2,5, R3,5 | Q'1,5, Q'2,5, Q'3,5 | |
| 15 | Q'1,6, Q'2,6, Q'3,6, Q'4,6, Q'5,6 | Q1,7, Q2,7, Q3,7, Q4,7, Q5,7 | R1,7, R2,7, R3,7, R4,7, R5,7 | R1,6, R2,6, R3,6, R4,6, R5,6 | Q'1,6, Q'2,6, Q'3,6, Q'4,6, Q'5,6 | |
| 16 | Q'1,7, Q'2,7, Q'3,7, Q'4,7, Q'5,7 | Q1,8, Q2,8, Q3,8, Q4,8, Q5,8 | R1,8, R2,8, R3,8, R4,8, R5,8 | R1,7, R2,7, R3,7, R4,7, R5,7 | Q'1,7, Q'2,7, Q'3,7, Q'4,7, Q'5,7 | |

| $Q_{1,1}$ | $Q_{1,2}$ | $Q_{1,3}$ | $Q_{1,4}$ | $Q_{1,5}$ | $Q_{1,6}$ | $Q_{1,7}$ | $Q_{1,8}$ |
|---|---|---|---|---|---|---|---|
|  |  |  |  |  | $Q_{2,6}$ | $Q_{2,7}$ | $Q_{2,8}$ |
| $Q_{2,1}$ | $Q_{2,2}$ | $Q_{2,3}$ | $Q_{2,4}$ | $Q_{2,5}$ | $Q_{3,6}$ | $Q_{3,7}$ | $Q_{3,8}$ |
|  |  |  |  |  | $Q_{4,6}$ | $Q_{4,7}$ | $Q_{4,8}$ |
| $Q_{3,1}$ | $Q_{3,2}$ | $Q_{3,3}$ | $Q_{3,4}$ | $Q_{3,5}$ | $Q_{5,6}$ | $Q_{5,7}$ | $Q_{5,8}$ |

↓ 1st to 9th cycles (B)

| $R_{1,1}$ | $Q_{1,2}$ | $Q_{1,3}$ | $Q_{1,4}$ | $Q_{1,5}$ | $Q_{1,6}$ | $Q_{1,7}$ | $Q_{1,8}$ |
|---|---|---|---|---|---|---|---|
|  |  |  |  |  | $Q_{2,6}$ | $Q_{2,7}$ | $Q_{2,8}$ |
| $R_{2,1}$ | $Q_{2,2}$ | $Q_{2,3}$ | $Q_{2,4}$ | $Q_{2,5}$ | $Q_{3,6}$ | $Q_{3,7}$ | $Q_{3,8}$ |
|  |  |  |  |  | $Q_{4,6}$ | $Q_{4,7}$ | $Q_{4,8}$ |
| $R_{3,1}$ | $Q_{3,2}$ | $Q_{3,3}$ | $Q_{3,4}$ | $Q_{3,5}$ | $Q_{5,6}$ | $Q_{5,7}$ | $Q_{5,8}$ |

↓ 10th cycle (C)

| $Q'_{1,1}$ | $R_{1,2}$ | $Q_{1,3}$ | $Q_{1,4}$ | $Q_{1,5}$ | $Q_{1,6}$ | $Q_{1,7}$ | $Q_{1,8}$ |
|---|---|---|---|---|---|---|---|
|  |  |  |  |  | $Q_{2,6}$ | $Q_{2,7}$ | $Q_{2,8}$ |
| $Q'_{2,1}$ | $R_{2,2}$ | $Q_{2,3}$ | $Q_{2,4}$ | $Q_{2,5}$ | $Q_{3,6}$ | $Q_{3,7}$ | $Q_{3,8}$ |
|  |  |  |  |  | $Q_{4,6}$ | $Q_{4,7}$ | $Q_{4,8}$ |
| $Q'_{3,1}$ | $R_{3,2}$ | $Q_{3,3}$ | $Q_{3,4}$ | $Q_{3,5}$ | $Q_{5,6}$ | $Q_{5,7}$ | $Q_{5,8}$ |

↓ 11th cycle (D)

| $Q'_{1,1}$ | $Q'_{1,2}$ | $R_{1,3}$ | $Q_{1,4}$ | $Q_{1,5}$ | $Q_{1,6}$ | $Q_{1,7}$ | $Q_{1,8}$ |
|---|---|---|---|---|---|---|---|
|  |  |  |  |  | $Q_{2,6}$ | $Q_{2,7}$ | $Q_{2,8}$ |
| $Q'_{2,1}$ | $Q'_{2,2}$ | $R_{2,3}$ | $Q_{2,4}$ | $Q_{2,5}$ | $Q_{3,6}$ | $Q_{3,7}$ | $Q_{3,8}$ |
|  |  |  |  |  | $Q_{4,6}$ | $Q_{4,7}$ | $Q_{4,8}$ |
| $Q'_{3,1}$ | $Q'_{3,2}$ | $R_{3,3}$ | $Q_{3,4}$ | $Q_{3,5}$ | $Q_{5,6}$ | $Q_{5,7}$ | $Q_{5,8}$ |

↓ 12th cycle (E)

| $Q'_{1,1}$ | $Q'_{1,2}$ | $Q'_{1,3}$ | $R_{1,4}$ | $Q_{1,5}$ | $Q_{1,6}$ | $Q_{1,7}$ | $Q_{1,8}$ |
|---|---|---|---|---|---|---|---|
|  |  |  |  |  | $Q_{2,6}$ | $Q_{2,7}$ | $Q_{2,8}$ |
| $Q'_{2,1}$ | $Q'_{2,2}$ | $Q'_{2,3}$ | $R_{2,4}$ | $Q_{2,5}$ | $Q_{3,6}$ | $Q_{3,7}$ | $Q_{3,8}$ |
|  |  |  |  |  | $Q_{4,6}$ | $Q_{4,7}$ | $Q_{4,8}$ |
| $Q'_{3,1}$ | $Q'_{3,2}$ | $Q'_{3,3}$ | $R_{3,4}$ | $Q_{3,5}$ | $Q_{5,6}$ | $Q_{5,7}$ | $Q_{5,8}$ |

↓ 13th cycle

F I G. 6

(F)

| Q'1,1 | Q'1,2 | Q'1,3 | Q'1,4 | R1,5 | Q1,6 | Q1,7 | Q1,8 |
|---|---|---|---|---|---|---|---|
|  |  |  |  |  | Q2,6 | Q2,7 | Q2,8 |
| Q'2,1 | Q'2,2 | Q'2,3 | Q'2,4 | R2,5 | Q3,6 | Q3,7 | Q3,8 |
|  |  |  |  |  | Q4,6 | Q4,7 | Q4,8 |
| Q'3,1 | Q'3,2 | Q'3,3 | Q'3,4 | R3,5 | Q5,6 | Q5,7 | Q5,8 |

↓ 14th cycle (G)

| Q'1,1 | Q'1,2 | Q'1,3 | Q'1,4 | Q'1,5 | R1,6 | Q1,7 | Q1,8 |
|---|---|---|---|---|---|---|---|
|  |  |  |  |  | R2,6 | Q2,7 | Q2,8 |
| Q'2,1 | Q'2,2 | Q'2,3 | Q'2,4 | Q'2,5 | R3,6 | Q3,7 | Q3,8 |
|  |  |  |  |  | R4,6 | Q4,7 | Q4,8 |
| Q'3,1 | Q'3,2 | Q'3,3 | Q'3,4 | Q'3,5 | R5,6 | Q5,7 | Q5,8 |

↓ 15th cycle (H)

| Q'1,1 | Q'1,2 | Q'1,3 | Q'1,4 | Q'1,5 | Q'1,6 | R1,7 | Q1,8 |
|---|---|---|---|---|---|---|---|
|  |  |  |  |  | Q'2,6 | R2,7 | Q2,8 |
| Q'2,1 | Q'2,2 | Q'2,3 | Q'2,4 | Q'2,5 | Q'3,6 | R3,7 | Q3,8 |
|  |  |  |  |  | Q'4,6 | R4,7 | Q4,8 |
| Q'3,1 | Q'3,2 | Q'3,3 | Q'3,4 | Q'3,5 | Q'5,6 | R5,7 | Q5,8 |

↓ 16th cycle (I)

| Q'1,1 | Q'1,2 | Q'1,3 | Q'1,4 | Q'1,5 | Q'1,6 | Q'1,7 | R1,8 |
|---|---|---|---|---|---|---|---|
|  |  |  |  |  | Q'2,6 | Q'2,7 | R2,8 |
| Q'2,1 | Q'2,2 | Q'2,3 | Q'2,4 | Q'2,5 | Q'3,6 | Q'3,7 | R3,8 |
|  |  |  |  |  | Q'4,6 | Q'4,7 | R4,8 |
| Q'3,1 | Q'3,2 | Q'3,3 | Q'3,4 | Q'3,5 | Q'5,6 | Q'5,7 | R5,8 |

↓ 17th cycle

DECODER AND DECODING METHOD FOR DECODING IRREGULAR LOW-DENSITY PARITY-CHECK CODES

CROSS-REFERENCE TO RELATED APPLICATIONS

This application is based upon and claims the benefit of priority from Japanese Patent Application No. 2005-159469, filed May 31, 2005, the entire contents of which are incorporated herein by reference.

BACKGROUND

1. Field

One embodiment of the invention relates to a decoder and decoding method for decoding irregular low-density parity-check codes with parity check matrices.

2. Description of the Related Art

Attention has recently been paid to low-density parity-check codes (LDPC codes) used as error detection and correction codes. Message-passing algorithms are known as a technique for decoding LDPC codes from, for example, Andrew J. Blanksby and Chris J. Howland, "A 690-mW 1-Gb/s 1024-b, Rate-1/2 Low-Density Parity-Check Code Decoder", IEEE Journal of Solid-State Circuits, Vol. 37, No. 3, pp. 404-412, March 2002. In the message-passing algorithms, to decode LDPC codes, bit update computation, which is performed for each row of a check matrix (parity-check matrix), and parity update computation, which is performed for each column of the matrix, are iteratedly executed.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not limit the scope of the invention.

FIG. 5 is a view illustrating information input and output in each cycle during bit update computation by the bit processing units and parity update computation by the parity processing units in the embodiment of the invention;

FIG. 6 is a view illustrating changes in the states of the areas of a memory corresponding to $(3 \times 5\ (n1 \times m1))$ first permuted matrices and $(5 \times 3\ (n2 \times m2))$ second permuted matrices, which provide the check matrix H in the embodiment of the invention; and FIG. 7 is a view illustrating changes in the states of the areas of the memory corresponding to $(3 \times 5\ (n1 \times m1))$ first permuted matrices and $(5 \times 3\ (n2 \times m2))$ second permuted matrices, which provide the check matrix H in the embodiment of the invention.

DETAILED DESCRIPTION

Various embodiments according to the invention will be described hereinafter with reference to the accompanying drawings. In general, according to one embodiment of the invention, bit processing units are provided for the $1^{st}$ to $M^{th}$ rows (M=p1×m1) of a parity-check matrix that includes a first parity-check matrix and second parity-check matrix adjacent thereto. The first and second parity-check matrices include (n1×m1) permuted matrices and (n2×m2) permuted matrices, respectively. The bit processing units sequentially update bit information corresponding to column positions included in the respective rows of the first and second parity-check matrices, a bit at each of the column positions being set to "1". The parity processing units update parity information corresponding to row positions in p1 columns of each of the n1 column blocks of the first parity-check matrix, and corresponding to row positions in p2 columns of each of the n2 column blocks of the second parity-check matrix, a bit at each of the row positions being set to "1".

Figure 1:
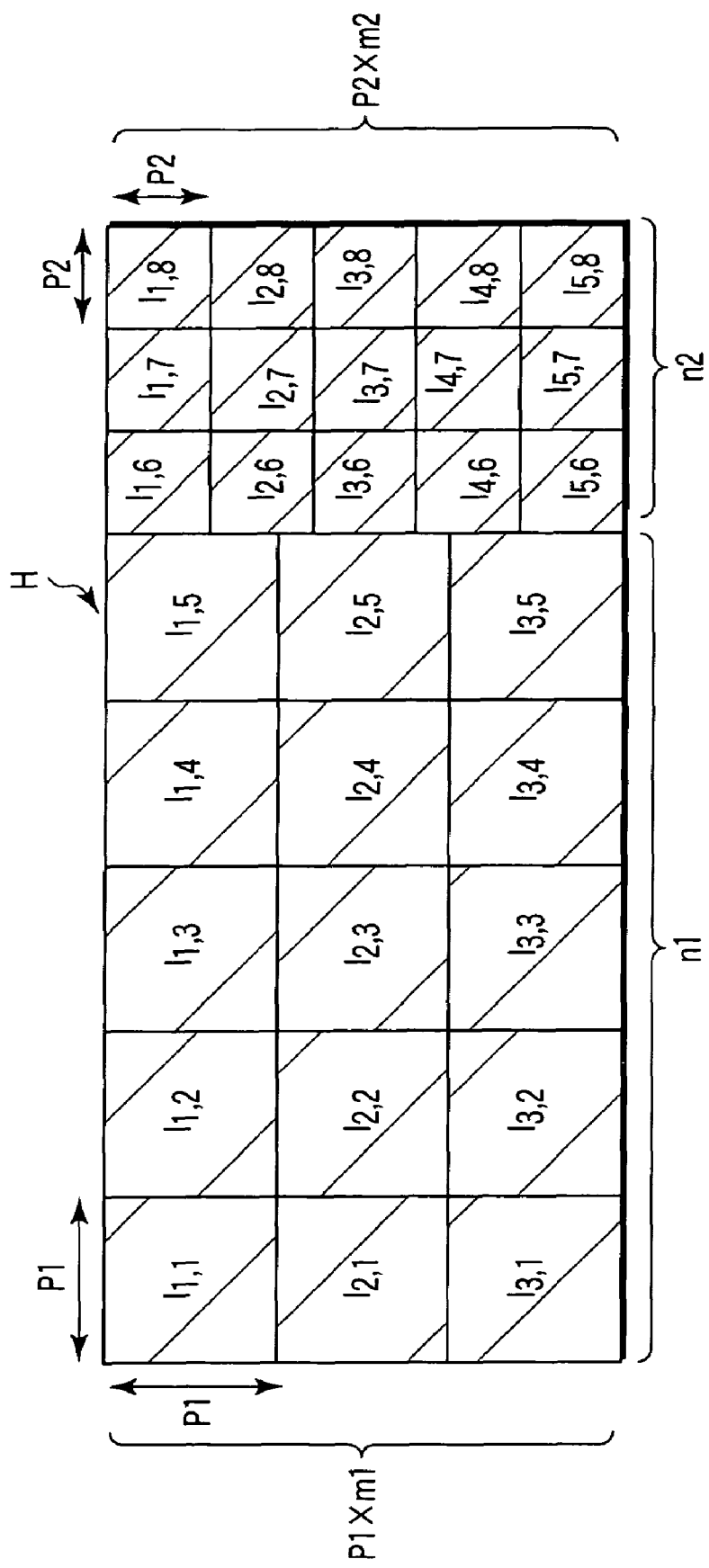
FIG. 1 is a view illustrating the structure of an irregular parity-check matrix H employed in an embodiment of the invention.

An embodiment of the invention will be described with reference to the accompanying drawings. Firstly, a description will be given of a parity-check matrix H of irregular low-density parity-check codes (irregular LDPC codes) employed in the embodiment. As shown in FIG. 1, the parity-check matrix H is a connected matrix formed of first and second parity check matrices connected to each other. The first parity check matrix is an array of (m1×n1) first permuted matrices $I_{g,h}$ (g=1, 2, ..., m1; h=1, 2, ..., n1). Each first permuted matrix $I_{g,h}$ is a sub-matrix. Each first permuted matrix $I_{g,h}$ is acquired by iterating, a number of times, exchange of two different rows or columns included in unit matrices I each having an array of (p1×p1). Similarly, the second parity matrix is an array of (m2×n2) second permuted matrices $I_{g,h}$ (g=1, 2, ..., m2; h=1, 2, ..., n2). Each second permuted matrix $I_{g,h}$ is a sub-matrix. Each second permuted matrix $I_{g,h}$ is acquired by iterating, a number of times, exchange of two different rows or columns included in unit matrices I each having an array of (p2×p2). The first and second parity matrices are constructed to satisfy the condition, p1×n1=p2×n2. In this case, the number M of rows of the check matrix H is p1m1, and the number N of columns of the matrix H is (p1n1+p2n2). In the example of FIG. 1, m1=3, n1=5, m2=5 and n2=3. Further, the check matrix H is divided into s column blocks (i.e., the $1^{st}$ to the $s^{th}$ column blocks). Permuted matrices $I_{1,h}, I_{2,h}$ and $I_{3,h}$ belong to the $h^{th}$ column block.

The check matrix H contains M (=p1m1) parity nodes, and N (=p1n1+p2n2) bit nodes. This check matrix H is constructed, assuming that the irregular LDPC code is N (=p1n1+p2n2) bits. The $j^{th}$ bit (j=1, 2, ..., N) of the irregular LDPC code is represented by $x_j$. As already known, each row of the check matrix H can be regarded as a parity-check equation. The parity-check equation corresponding to the $i^{th}$ row of the check matrix H is called an $i^{th}$ parity-check equation. The N-bit irregular LDPC code must satisfy all parity-check equations of the check matrix H, i.e., the $1^{st}$ to the $M^{th}$ parity-check equations.

The oblique lines in each permutated matrix $I_{g,h}$ indicate the locus of the positions of "1" bits. As is evident from FIG. 1, only one "1" bit exists in each row and each column of {3(m1)×5(n1)} first permutated matrices, and in each row and each column of {5(m2)×3(n2)} second permutated matrices, the first and second permuted matrixes providing the check matrix H. Accordingly, the numbers of "1" bits contained in each row and each column of the check matrix H and n1 and m1 in the matrix of (n1×m1), respectively, and are n2 and m2 in the matrix of (n1×m1), respectively, and are n2 and m2 in the matrix of (n2×m2), respectively. m1 and n1 are set to satisfy m1<n1. Accordingly, in the matrix of (n1×m1) included in the check matrix H, the number "1" bits in each row is greater than that in each column.

To decode each irregular LDPC code using the message-passing algorisms, it is necessary, in general, to iterate bit update computation and parity update computation.

Generally, bit update computation can be expressed by the following equation:

$$r_{i,j} = -\prod_{j' \in M(i) \backslash i} \text{sgn}(q_{i,j'}) \psi\left(\sum_{j' \in M(i) \backslash j} \psi(q_{i,j'})\right) \quad (1)$$

In the above equation, $r_{i,j}$ is acquired by passing corresponding parity information (reliability information) $q_{i,j}$ to each bit of the $i^{th}$ row of the check matrix H (except for the $j^{th}$ bit in the $i^{th}$ row). $r_{i,j}$ is bit information (reliability information) indicating reliability concerning code bit $x_j$ corresponding to the $j^{th}$ bit in the $i^{th}$ row. Assume here that $r_{i,j}$ does not indicate the probability itself that code bit $x_j$ is 0 or 1, but the logarithmic value of the probability. The reason why such a logarithmic value is used is that it enables multiplication/division to be replaced with addition/subtraction.

M(i) represents a set of column positions of "1" bits in the $i^{th}$ row of the check matrix H. M(i)\j represents M(i) except for j.

j'∈ M(i)\j represents an arbitrary column position included in M(i) except for j.

$q_{i,j'}$ is parity information (reliability information) indicating reliability concerning code bit $x_{j'}$ corresponding to the $j^{th}$ bit in the $i^{th}$ row of the check matrix H. Assume that $q_{i,j'}$ does not indicate the probability itself that code bit $x_{j'}$ is 0 or 1, but the logarithmic value of the probability.

sgn ($q_{i,j'}$) represents the sign of $q_{i,j'}$. The sign of $q_{i,j'}$ is represented by the most significant bit MSB of $q_{i,j'}$. If $q_{i,j'}$ is negative, sgn ($q_{i,j'}$)=−1, and MSB ($q_{i,j'}$)=1. In contrast, if $q_{i,j'}$ is not negative, i.e., if it is 0 or positive, sgn ($q_{i,j'}$)=+1, and MSB ($q_{i,j'}$)=0. ψ( ) represents a function (hereinafter referred to as "ψ function") for probability computation.

Further, parity update computation is expressed by the following equation:

$$q_{i,j} = p_j + \sum_{i' \in N(j) \backslash i} r_{i',j} \quad (2)$$

In the above equation (2), $q_{i,j}$ is acquired by passing, from a certain bit node to a corresponding parity node, bit information (reliability information) $r_{i',j}$ corresponding to each bit of the $j^{th}$ column of the check matrix H (except for the $i^{th}$ bit in the $j^{th}$ column). $q_{i,j}$ is parity information (reliability information) indicating reliability concerning code bit $x_j$ corresponding to the $j^{th}$ bit in the $i^{th}$ row of the check matrix H. $q_{i,j}$ is used as the above-mentioned $q_{i,j'}$ for bit update computation expressed by the equation (1).

$p_j$ represents the logarithmic value of the probability (initial probability) that the $j^{th}$ bit $x_j$ is 1 or 0, which is estimated from an irregular LDPC code when it is output through a communication channel. The initial value of $q_{i,j}$ corresponding to each "1" bit in the check matrix H is identical to $p_j$.

N(j) represents a set of row positions of "1" bits in the $j^{th}$ column of the check matrix H. N(j)\i represents N(j) except for i. i'∈N(j)\i represents an arbitrary row position included in N(j) except for i.

$r_{i',j}$ is bit information (reliability information) indicating reliability concerning the $j^{th}$ bit $x_j$ in the $i^{th}$ row of the check matrix H. $r_{i,j}$ updated by computation using the equation (1) is used as $r_{i',j}$.

Figure 2:
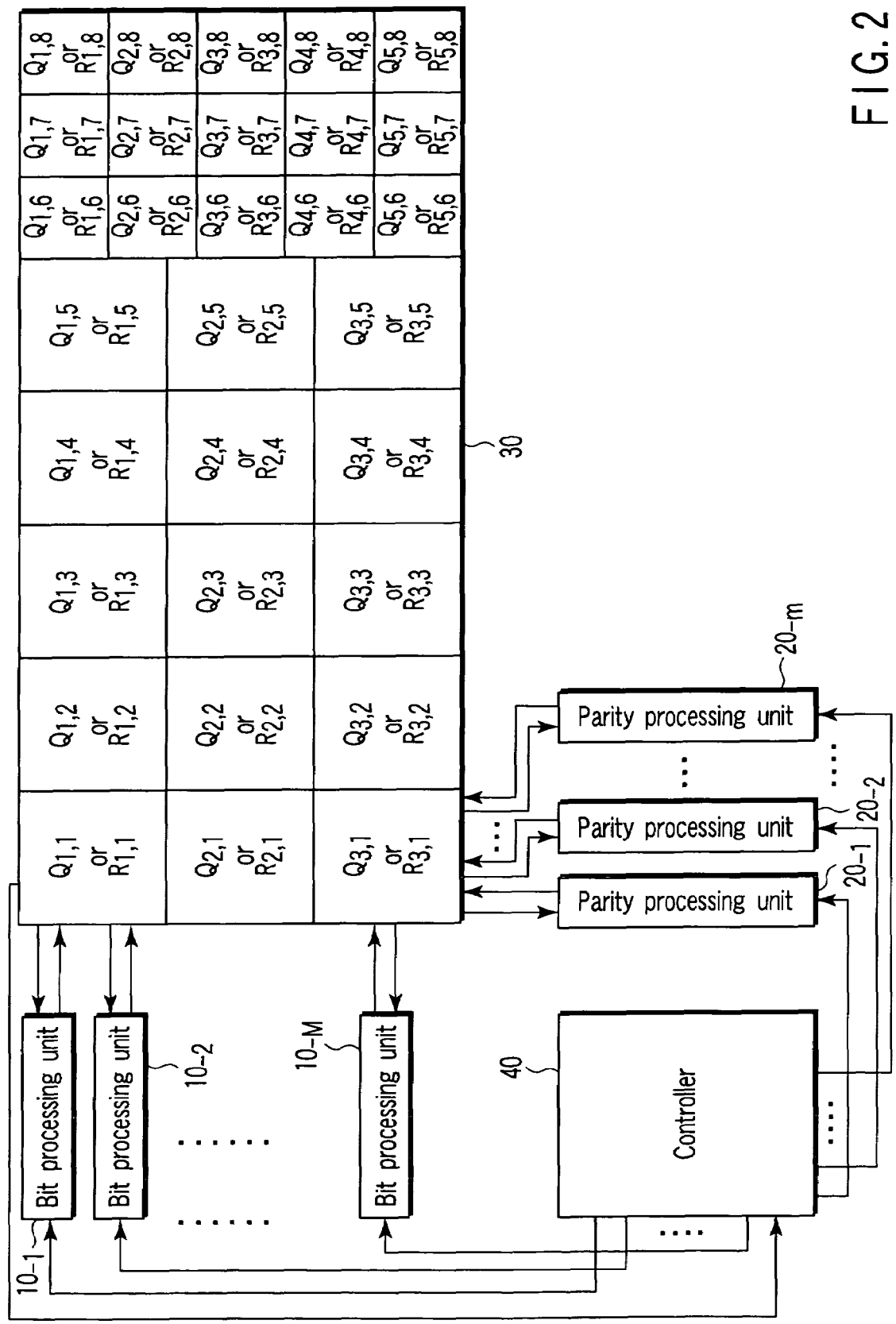
FIG. 2 is an exemplary block diagram illustrating the configuration of an irregular LDPC-code decoder according to the embodiment of the invention.

FIG. 2 is a block diagram illustrating the configuration of an irregular LDPC-code decoder according to the embodiment. As shown in FIG. 2, the irregular LDPC-code decoder comprises M (=p1m1=3p1) bit processing units 10-1 to 10-M, p1 parity processing units 20-1 to 20-m, a memory 30 and a controller 40. When, in the parity check matrix H, p1×m1=p2×m2, the number of the parity processing units 20-1 to 20-m is made to correspond to the greater one of p1 and p2.

The bit processing units 10-1 to 10-M are provided for the first to $M^{th}$ rows of the check matrix H, respectively. Each bit processing unit 10-$i$ ($i$=1, 2, . . . , M) executes bit update computation, expressed by the equation (1), on the $i^{th}$ row of the check matrix H.

The parity processing units 20-1 to 20-m are common units used for all permuted matrices $I_{g,h}$ included in the first and second parity check matrices of the check matrix H, and are provided for the $1^{st}$ to p1$^{th}$ columns of each permuted matrix $I_{g,h}$ included in the first parity check matrix. Concerning h (=1, 2, . . . , n1; n1=5), each parity processing unit 20-$k$ ($k$=1, 2, . . . , p1) is used to perform parity update computation on the ((h−1)p1+k)$^{th}$ column in the check matrix H, to which the k$^{th}$ column of each permuted matrix $I_{g,h}$ belongs. Namely, in the embodiment wherein p1=5, each parity processing unit 20-$k$ is used to perform parity update computation on the k$^{th}$ column, (p1+k)$^{th}$ column, (2(p1)+k)$^{th}$ column, (3(p1)+k)$^{th}$ column and (4(p1)+k)$^{th}$ column of the first parity check matrix. The parity processing unit 20-1, for example, is used to perform parity update computation on the $1^{st}$ column, (p1+1)$^{th}$ column, (2(p1)+1)$^{th}$ column, (3(p1)+1)$^{th}$ column and (4(p1)+1)$^{th}$ column of the first parity check matrix. Similarly, the parity processing unit 20-m, for example, is used to perform parity update computation on the p1$^{th}$ column, 2(p1)$^{th}$ column, 3(p1)$^{th}$ column, 4(p1)$^{th}$ column and 5(p1)$^{th}$ column (the {N−(p2n2)}$^{th}$ column) of the first parity check matrix.

Further, in the second parity check matrix, concerning h (=n1+1, n1+2, . . . , n1+n2 ; n1=5 and n2=3), each parity processing unit 20-$k$ ($k$=1, 2, . . . , p2) is used to perform parity update computation on the ((h−1)p2+k)$^{th}$ column in the check matrix H, to which the k$^{th}$ column of each permuted matrix $I_{g,h}$ belongs. Namely, in the second parity check matrix, part of the parity processing units 20-1 to 20-m, i.e., the parity processing units 20-1 to 20-p2 are used. In the second parity check matrix, each parity processing unit 20-$k$ is used to perform parity update computation on the k$^{th}$ column, (p2+k)$^{th}$ column and (2(p2)+k)$^{th}$ column. The parity processing unit 20-1, for example, is used to perform parity update computation on the $1^{st}$ column, (p2+1)$^{th}$ column and (2(p2)+1)$^{th}$ column. Similarly, the parity processing unit 20-m, for example, is used to perform parity update computation on the p2$^{th}$ column, 2(p2)$^{th}$ column and 3(p2)$^{th}$ column. The memory 30 is used to store bit information calculated by the bit processing units 10-1 to 10-M, and parity information calculated by the parity processing units 20-1 to 20-m. Assume here that the memory 30 is formed of (3×5) (=n1×m1) memory units corresponding to (3×5) (=n1×m1) permuted matrices included in the check matrix H, i.e., $I_{1,1}$, $I_{2,1}$, $I_{3,1}$, $I_{1,2}$, $I_{2,2}$, $I_{3,2}$, $I_{1,3}$, $I_{2,3}$, $I_{3,3}$, $I_{1,4}$, $I_{2,4}$, $I_{3,4}$, $I_{1,5}$, $I_{2,5}$ and $I_{3,5}$, and also formed of (5×3) (=n2×m2) memory units corresponding to (5×3) (=n2×m2) permuted matrices included in the check matrix H, i.e., $I_{1,6}, I_{2,6}, I_{3,6}, I_{4,6}, I_{5,6}, I_{1,7}, I_{2,7}, I_{3,7}, I_{4,7}, I_{5,7}, I_{1,8}, I_{2,8}, I_{3,8}, I_{4,8}$ and $I_{5,8}$. The (5×3) (=n1×m1) memory units and the (5×3) (=n2×m2) memory units can be simultaneously accessed. The state of the storage area of the memory 30 corresponding to each of permuted matrices $I_{g,h}$ is represented by $Q_{g,h}$ or $R_{g,h}$.

$Q_{g,h}$ indicates that parity information is stored in a storage area of the memory 30 corresponding to $Q_{g,h}$.

$R_{g,h}$ indicates that bit information is stored in a storage area of the memory 30 corresponding to $R_{g,h}$.

The controller 40 controls decoding processing of an irregular LDPC code input to the irregular LDPC-code decoder. Specifically, the controller 40 functions as a sequencer for controlling the operations of the bit processing units 10-1 to 10-M and parity processing unit 20-1 to 20-m.

Figure 3:
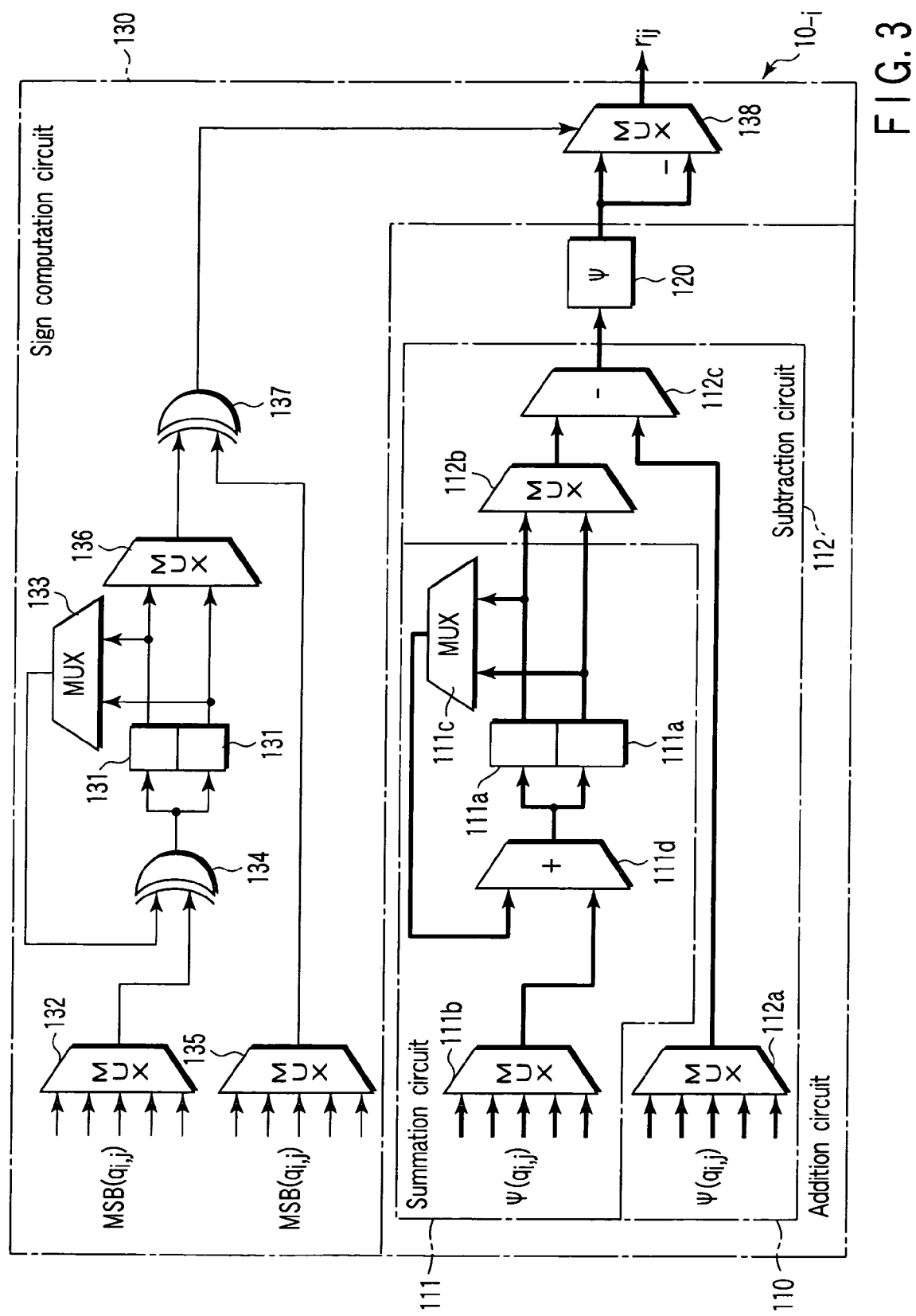
FIG. 3 is an exemplary block diagram illustrating the configuration of the bit processing unit in the embodiment of the invention.

FIG. 3 is a block diagram illustrating the bit-processing unit 10-i (i=1, 2, . . . , M) appearing in FIG. 2. Bit update computation expressed by the equation (1) mainly comprises a product part of $\Pi$ operation, a $\psi$ function part and a summation part of $\Sigma$ operation. The $\psi$ function part, i.e., the $\psi( )$ operation, can be realized using a lookup table. In light of this, the bit processing unit 10-i is formed of a summation circuit 110, lookup table (LUT) 120 and sign computation circuit 130. The summation circuit 110 corresponds to the summation part. The lookup table 120 and sign computation circuit 130 correspond to the $\psi$ function part and product part, respectively.

The summation part can be divided into an adder section and subtracter section. The adder section calculates the sum of $\psi(q_{i,j})$ values corresponding to positions j in the $i^{th}$ row of the check matrix H, at which the bit is set to "1". The subtracter section subtracts, from the sum calculated by the adder section, $\psi(q_{i,j})$ corresponding to position j in the $i^{th}$ row at which the bit is set to "1". In light of this, in the embodiment, the summation circuit 110 is formed of an addition circuit 111 and subtraction circuit 112.

The addition circuit 111 comprises a pair of registers 111a, multiplexers (MUX) 111b and 111b, and adder 111d. The registers 111a are used to hold the intermediate result (or final result) of addition processing for calculating the sum of $\psi(q_{i,j})$ values. The final result of addition processing is the last intermediate result, and indicates the sum of $\psi(q_{i,j})$ values. When one of the registers 111a holds the sum of $\psi(q_{i,j})$ values, the other register 111a is used to hold a new intermediate result of addition processing used for calculating a new sum of $\psi(q_{i,j})$ values. Thus, the functions of the registers 111a as respective registers for holding the sum and the intermediate result of $\psi(q_{i,j})$ values are switched each time the sum of $\psi(q_{i,j})$ values is calculated.

The multiplexer 111b sequentially selects $\psi(q_{i,j})$ corresponding to each position (column position) j in the $i^{th}$ row of the check matrix H, at which the bit is set to "1". Position j in the $i^{th}$ row of the check matrix H, at which the bit is set to "1", can be determined uniquely in units of rows. Accordingly, $\psi(q_{i,j})$ corresponding to position j in the $i^{th}$ row at which the bit is set to "1" can be determined uniquely. The multiplexer 111c selects the intermediate result (the result of the preceding addition process) held by one of the registers 111a. The adder 111d adds $\psi(q_{i,j})$ selected by the multiplexer 111b to the intermediate result selected by the multiplexer 111c. The addition result of the adder 111d indicates a new intermediate result of addition processing for calculating the sum of $\psi(q_{i,j})$ values. The intermediate result held by the register 111a and used for addition of the adder 111d is updated to the addition result of the adder 111d, i.e., the new intermediate result of addition processing for calculating the sum of $\psi(q_{i,j})$ values.

As described above, the multiplexer 111b sequentially selects $\psi(q_{i,j})$ corresponding to each position j in the $i^{th}$ row of the check matrix H, at which the bit is set to "1". Further, each time the multiplexer 111b selects $\psi(q_{i,j})$, the addition circuit 111 adds the selected $\psi(q_{i,j})$ to the intermediate result held by one of the registers 111a (i.e., the intermediate result selected by the multiplexer 111c). Each time this addition is performed, the intermediate result of the register 111a used for the addition is updated to a new intermediate result as the addition result. Assume that later on, $\psi(q_{i,j})$ corresponding to the last position j in the $i^{th}$ row is added to the intermediate result held by the register 111a at this time. As is apparent, the result of this addition indicates the sum of $\psi(q_{i,j})$ values, i.e., the sum of $\psi(q_{i,j})$ values corresponding to all positions j included in M(i).

Assume further that processing of one row of each permuted matrices $I_{g,h}$ in the addition circuit 111, i.e., one addition process, can be performed by one cycle. In this case, the operation of the addition circuit 111 for calculating the sum of $\psi(q_{i,j})$ values can be executed in (n1+n2 (=8)) cycles. Assuming that one cycle is time Tcyc, the sum of $\psi(q_{i,j})$ values can be executed in (n1+n2 (=8)) Tcyc.

The subtraction circuit 112 comprises multiplexers (MUX) 112a and 112b, and a subtracter 112c. The multiplexer 112a sequentially selects $\psi(q_{i,j})$ corresponding to each position j in the $i^{th}$ row of the check matrix H, at which the bit is set to "1", in cycles following the cycle in which the sum of $\psi(q_{i,j})$ values corresponding to positions j in the $i^{th}$ row of the check matrix H, at which the bit is set to "1", is held by one of the registers 111a. On the other hand, the multiplexer 112b selects the output of the register 111a, i.e., the above-mentioned sum. The subtracter 112c subtracts $\psi(q_{i,j})$ selected by the multiplexer 112a from the sum selected by the multiplexer 112b. As a result, the sum of $\psi(q_{i,j'})$ values corresponding to all positions j' that satisfy M(i)\j can be acquired. The subtraction, by the subtracter 112c, of $\psi(q_{i,j})$ from the sum held by the one register 111a is performed concerning $\psi(q_{i,j})$ values corresponding to all positions j in the $i^{th}$ row of the check matrix H, at which the bit is set to "1".

Thus, the subtraction circuit 112 sequentially calculates the sum of $\psi(q_{i,j'})$ values corresponding to all positions j' that satisfy M(i)\j. The calculation of the sum of $\psi(q_{i,j'})$ values corresponding to all positions j' that satisfy M(i)\j, performed concerning each position j in the $i^{th}$ row of the check matrix H, at which the bit is set to "1", can be executed in (n1+n2 (=8)) cycles. During the subtraction process by the subtraction circuit 112, the addition circuit 111 can perform the next addition process. At this time, the multiplexer 111c selects the other of the registers 111a (i.e., the register that is not selected by the multiplexer 112b during the subtraction process by the subtraction circuit 112). The content of the other register is updated to the addition result of the adder 111d included in the addition circuit 111. However, the next addition process by the addition circuit 111 is started after the parity processing unit 20-k acquires new $\psi(q_{i,j})$ corresponding to each new position i in the $1^{st}$ to $p1^{th}$ columns of the first parity check matrix and in the $1^{st}$ to $p2^{th}$ columns of the second parity check matrix, at which the bit is set to "1".

The lookup table 120 is used to convert the subtraction result of the subtracter 112 (i.e., the computation result of the sum computation circuit 110) into an operation value of the $\psi$ function, i.e., $\psi$ (subtraction result). The lookup table 120 is referred to, using the subtraction result of the subtracter 112. Assume that the subtraction result is x. The entry of the lookup table 120 designated by x prestores $\psi(x)$ unique to x. Accordingly, $\psi(x)$ can be acquired from the lookup table 120 simply by referring to the table 120 using the subtraction result x of the subtracter 112. In the embodiment, the entry of the lookup table 120 designated by x stores ψ(x)=−log(tan h(x/2)).

The sign computation circuit 130 comprises a pair of registers 131, multiplexers (MUX) 132 and 133, exclusive-OR circuit 134, multiplexers (MUX) 135 and 136, exclusive-OR circuit 137 and multiplexer (MUX) 138. The registers 131 are each a register of, for example, 1 bit used to hold the intermediate result (or final result) of sign computation. When one of the registers 131 holds the final result of sign computation, the other register is used to hold the intermediate result of new sign computation.

The multiplexer 132 sequentially selects an MSB of $q_{i,j}$, i.e., a sign, corresponding to each position j in the $i^{th}$ row of the check matrix H, at which the bit is set to "1". Each MSB of $q_{i,j}$ will be often expressed by MSB($q_{i,j}$). The multiplexer 133 selects the intermediate result (sign) of sign computation so far held by one of the registers 111a. The exclusive-OR circuit 134 acquires the exclusive-OR of the sign selected by the multiplexer 132 and the intermediate result (sign) of sign computation so far. The exclusive-OR result of the exclusive-OR circuit 134 indicates a new intermediate result of sign computation. The intermediate result in the register 131 used for the operation of the exclusive-OR circuit 134 is updated to the exclusive-OR result of the exclusive-OR circuit 134, i.e., the new intermediate result of sign computation.

As described above, the multiplexer 132 sequentially selects MSB($q_{i,j}$) corresponding to each position j in the $i^{th}$ row of the check matrix H, at which the bit is set to "1". Each time the multiplexer 132 selects MSB($q_{i,j}$), the sign computation circuit 130 executes the operation of acquiring the exclusive-OR of the selected MSB($q_{i,j}$) and the intermediate result (sign) of sign computation held by the register 131 at this time. Further, each time exclusive-OR is computed, the intermediate result held by the register 131 and used for the exclusive-OR computation is updated to a new intermediate result as the result of the computation. Assume that later on, the exclusive-OR of MSB($q_{i,j}$) corresponding to the last position j in the $i^{th}$ row and the intermediate result held by the register 131 at this time is computed. As is apparent, the result (final result) of this exclusive-OR computation indicates the product of the signs of $q_{i,j}$ corresponding to all positions j in the $i^{th}$ row at which the bit is set to "1", i.e., the product of the signs of $q_{i,j}$ corresponding to all positions j included in M(i). The above-described operation of the sign computation circuit 130 for computing the exclusive-OR concerning MSB ($q_{i,j}$), namely, the sign computation, is performed in synchronism with the addition process of the addition circuit 111, and can be executed in (n1+n2 (=8)) cycles.

The multiplexer 135 sequentially selects MSB($q_{i,j}$) corresponding to each position j in the $i^{th}$ row of the check matrix H, at which the bit is set to "1". The selection operation of the multiplexer 135 is executed in cycles following the cycle in which the exclusive-OR concerning MSB($q_{i,j}$) values corresponding to all positions j included in M(i) (i.e., the final result of the exclusive-OR computation indicating the product) is held by one of the registers 131. On the other hand, the multiplexer 136 selects the output of the register 131, i.e., the above-mentioned exclusive-OR (the final result of the exclusive-OR computation). The exclusive-OR circuit 137 acquires the exclusive-OR of the exclusive-OR selected by the multiplexer 136 and MSB($q_{i,j}$) selected by the multiplexer 135. As a result, the product of the signs of $q_{i,j'}$ values corresponding to all positions j' that satisfy M(i)\j can be acquired. The operation of the exclusive-OR circuit 137 for acquiring the exclusive-OR of the product (held by the one register 131) and MSB($q_{i,j}$) is performed concerning MSB($q_{i,j}$) values corresponding to all positions j in the $i^{th}$ row of the check matrix H, at which the bit is set to "1". Accordingly, concerning each position j in the $i^{th}$ row of the check matrix H, at which the bit is set to "1", the sign computation circuit 130 sequentially computes the product of the signs of $q_{i,j}$ corresponding to all positions j' that satisfy M(i)\j. In accordance with the output of the exclusive-OR circuit 137, the multiplexer 138 selects, as $r_{i,j}$, the output of the lookup table 120 or a value acquired by inverting the sign of this output.

Figure 4:
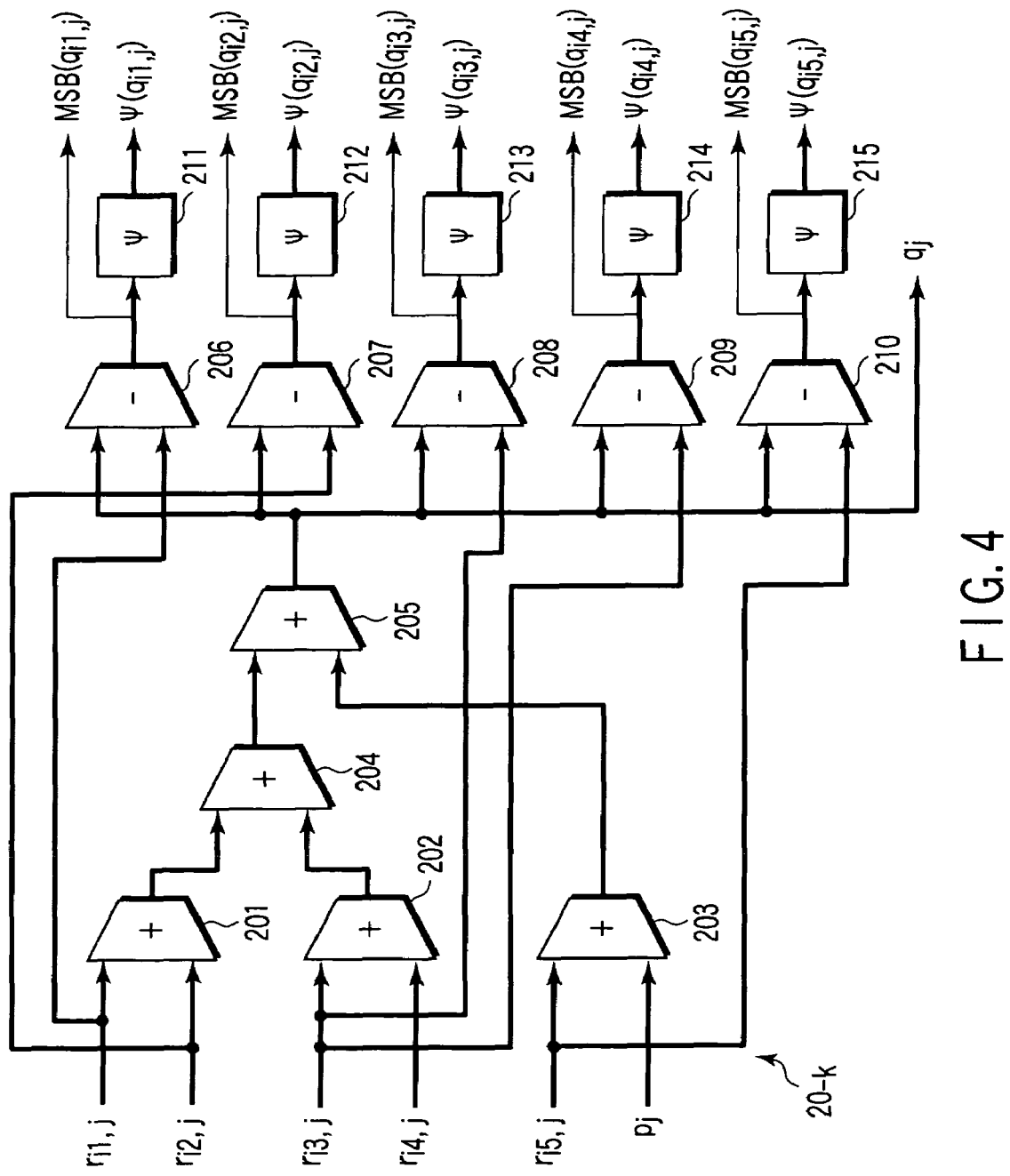
FIG. 4 is an exemplary block diagram illustrating the configuration of the parity processing unit in the embodiment of the invention.

FIG. 4 is a block diagram illustrating the configuration of the parity processing unit 20-k (k=1, 2, ..., m). The parity processing unit 20-k is configured to simultaneously perform parity update computation on all columns j, using $r_{i,j}$ corresponding to each position (row position) i in the $j^{th}$ column of the check matrix H, at which the bit is set to "1". To this end, the parity processing unit 20-k comprises five adders 201, 202, 203, 204 and 205, and five subtracters 206, 207, 208, 209 and 210, and five lookup tables (LUT) 211, 212, 213, 214 and 215 as shown in FIG. 4. During the process performed on the first parity check matrix, $r_{i1,j}$ and $r_{i2,j}$ are input to the adder 201, $r_{i3,j}$ ($r_{i4,j}$ is "0") is input to the adder 202, and $p_j$ ($r_{i5,j}$ is "0") is input to the adder 203. Further, during the process performed on the second parity check matrix, $r_{i1,j}$ and $r_{i2,j}$ are input to the adder 201, $r_{i3,j}$ and $r_{i4,j}$ are input to the adder 202, and $p_j$ and $r_{i5,j}$ are input to the adder 203. The adder 201 adds up $r_{i1,j}$ and $r_{i2,j}$, the adder 202 adds up $r_{i3,j}$ and $r_{i4,j}$, and the adder 203 adds up $p_j$ and $r_{i5,j}$. $r_{i1,j}$, $r_{i2,j}$, $r_{i3,j}$, $r_{i4,j}$ and $r_{i5,j}$ represent bit information items corresponding to bit positions i1, i2, i3, i4 and i5 in the $j^{th}$ column (column j) of the parity check matrix H, at which the bit is set to "1". Assume here that the $j^{th}$ column of the first parity check matrix is positioned in three permuted matrices $I_{1,h}$, $I_{2,h}$ and $I_{3,h}$ (of the $h^{th}$ column block). In this case, each of the permuted matrices $I_{1,h}$, $I_{2,h}$ and $I_{3,h}$ contains one position in the $j^{th}$ column, at which the bit is set to "1". Namely, $r_{i1,j}$, $r_{i2,j}$ and $r_{i3,j}$ represent bit information items corresponding to bit positions in the permuted matrices $I^{1,h}$, $I_{2,h}$ and $I_{3,h}$ and in the $j^{th}$ column of the first parity check matrix, at which the bit is set to "1". The bit positions i1, i2 and i3 in the $j^{th}$ column of the first parity check matrix, at which the bit is set to "1", can be uniquely determined in units of rows. Accordingly, $r_{i1,j}$, $r_{i2,j}$ and $r_{i3,j}$ corresponding to the bit positions i1, i2 and i3 in the $j^{th}$ column, at which the bit is set to "1", can be uniquely determined.

Similarly, assume here that the $j^{th}$ column of the second parity check matrix is positioned in five permuted matrices $I_{1,h}$, $I_{2,h}$, $I_{3,h}$, $I_{4,h}$, and $I_{5,h}$ (of the $h^{th}$ column block). In this case, each of the permuted matrices $I_{1,h}$, $I_{2,h}$, $I_{3,h}$, $I_{4,h}$, and $I_{5,h}$ contains one position in the $j^{th}$ column, at which the bit is set to "1". Namely, $r_{i1,j}$, $r_{i2,j}$, $r_{i3,j}$, $r_{i4,j}$ and $r_{i5,j}$ represent bit information items corresponding to bit positions in the permuted matrices $I_{1,h}$, $I_{2,h}$, $I_{3,h}$, $I_{4,h}$, and $I_{5,h}$ in the $j^{th}$ column of the second parity check matrix, at which the bit is set to "1". The bit positions i1, i2, i3, i4 and i5 in the $j^{th}$ column of the second parity check matrix, at which the bit is set to "1", can be uniquely determined in units of rows. Accordingly, $r_{i1,j}$, $r_{i2,j}$, $r_{i3,j}$, $r_{i4,j}$ and $r_{i5,j}$ corresponding to the bit positions i1, i2, i3, i4 and i5 in the $j^{th}$ column, at which the bit is set to "1", can be uniquely determined.

The adder 204 adds up the addition results of the adders 201 and 202. Namely, the adder 204 sums up $r_{i1,j}$, $r_{i2,j}$, $r_{i3,j}$ and $r_{i4,j}$. The adder 205 adds up the addition results of the adders 203 and 204. Namely, the adder 204 sums up $p_j$ and the total of $r_{i1,j}$, $r_{i2,j}$, $r_{i3,j}$, $r_{i4,j}$ and $r_{i5,j}$. Thus, the adders 201 to 205 provide an addition circuit for summing up $p_j$ and the total of $r_{i1,j}$, $r_{i2,j}$, $r_{i3,j}$, $r_{i4,j}$ and $r_{i5,j}$. The addition result of the adder 205 indicates the probability $q_j$ of bit $x_j$ in the irregular LDPC code being 1 or 0, which is estimated at the present stage.

The subtracter 206 subtracts $r_{i1,j}$ from the addition result of the adder 205. The subtraction result of the subtracter 206 indicates updated parity information $q_{i1,j}$. The subtracter 207 subtracts $r_{i2,j}$ from the addition result of the adder 205. The subtraction result of the subtracter 207 indicates, updated parity information $q_{i2,j}$. The subtracter 208 subtracts $r_{i3,j}$ from the addition result of the adder 205. The subtraction result of the subtracter 208 indicates updated parity information $q_{i3,j}$. The subtracter 209 subtracts $r_{i4,j}$ from the addition result of the adder 205. The subtraction result of the subtracter 209 indicates updated parity information $q_{i4,j}$. The subtracter 210 subtracts $r_{i5,j}$ from the addition result of the adder 205. The subtraction result of the subtracter 210 indicates updated parity information $q_{i5,j}$.

In other words, in each parity processing unit 20-k, three $q_{i1,j}$, $q_{i2,j}$ and $q_{i3,j}$ corresponding to "1" bits in the $j^{th}$ column (j=k, p1+k, 2(p1)+k, 3(p1)+k, 4(p1)+k) of the first parity check matrix can be simultaneously acquired. As a result, $MSB(q_{i1,j})$, $MSB(q_{i2,j})$ and $MSB(q_{i3,j})$ can be acquired. Further, $\psi(q_{i1,j})$, $\psi(q_{i2,j})$ and $\psi(q_{i3,j})$ can also be simultaneously acquired by simultaneously referring to the lookup tables 211, 212 and 213 using $q_{i1,j}$, $q_{i2,j}$ and $q_{i3,j}$ as the subtraction results of the subtracters 206, 207 and 208. $\psi(q_{i1,j})$, $\psi(q_{i2,j})$ and $\psi(q_{i3,j})$ are used as $\psi(q_{i,j})$ for bit update computation in each bit processing unit 10-i.

Further, in each parity processing unit 20-k, five $q_{i1,j}$, $q_{i2,j}$, $q_{i3,j}$, $q_{i4,j}$ and $q_{i5,j}$ corresponding to "1" bits in the $j^{th}$ column (j=k, p2+k, 2(p2)+k) of the second parity check matrix can be simultaneously acquired. As a result, $MSB(q_{i1,j})$, $MSB(q_{i2,j})$, $MSB(q_{i3,j})$ $MSB(q_{i4,j})$ and $MSB(q_{i5,j})$ can be acquired. Further, $\psi(q_{i1,j})$, $\psi(q_{i2,j})$, $\psi(q_{i3,j})$ $\psi(q_{i4,j})$ and $\psi(q_{i5,j})$ can also be simultaneously acquired by simultaneously referring to the lookup tables 211 to 214 using $q_{i1,j}$, $q_{i2,j}$, $q_{i3,j}$, $q_{i4,j}$ and $q_{i5,j}$ as the subtraction results of the subtracters 206 to 210. $\psi(q_{i1,j})$, $\psi(q_{i2,j})$, $\psi(q_{i3,j})$, $\psi(q_{i4,j})$ and $\psi(q_{i5,j})$ are used as $\psi(q_{i,j})$ for bit update computation in each bit processing unit 10-i.

As described above, in the embodiment, the lookup tables 211 to 215 are provided at the output side of each parity processing unit 20-k. Instead of providing the lookup tables 211 to 215 at the output side of each parity processing unit 20-k, respective lookup tables may be provided at the output side of the multiplexers 132 and 135 in each bit processing unit 10-i. In this case, however, five lookup tables are necessary for each bit processing unit (i.e., for processing each row), although no lookup table is necessary for each parity processing unit. Accordingly, the irregular LDPC-code decoder requires (5×p1m1=15p1) lookup tables in total. In contrast, in the embodiment, one lookup table is necessary for each bit processing unit 10-i, and m2 lookup tables are necessary for each parity processing unit 20-k. That is, the irregular LDPC-code decoder requires only 8(p1) (=p1(m1+m2)= (1×p1m1)+(m2×p1)) lookup tables in total. Thus, in the irregular LDPC-code decoder of the embodiment in which lookup tables are provided at the output side of each parity processing unit 20-k, the number of required lookup tables can be reduced from 15(p1) to 8(p1). Referring then to FIGS. 5 to 7, a description will be given of the flow of computation performed in the bit processing units 10-1 to 10-M and parity processing units 20-1 to 20-m. The bit processing units 10-1 to 10-M and parity processing units 20-1 to 20-m are controlled by the controller 40 incorporated in the LDPC-code decoder shown in FIG. 2. FIG. 5 shows input/output information in each cycle during bit update computation (horizontal computation processing HCALC) by the bit processing units 10-1 to 10-M and parity update computation (vertical computation processing VCALC) by the parity processing units 20-1 to 20-m. FIGS. 6 and 7 show changes in the states of regions that are included in the memory 30 and correspond to the (3×5 (=n1×m1)) permuted matrices and the (5×3 (=n2× m2)) permuted matrices, which are included in the check matrix H. In FIGS. 5 to 7, a set of $\psi(q_{i,j})$ values and a set of $r_{i,j}$ values are represented by $Q_{g,h}$ and $R_{g,h}$, respectively. The $\psi(q_{i,j})$ values and $r_{i,j}$ values respectively correspond to the bit positions in the permuted matrices $I_{g,h}$ (g=1, 2, 3; h=1, 2, . . . , 5) of the first parity check matrix, at which the bit is set to "1", and those in the permuted matrices $I_{g,h}$ (g=1, 2, . . . , 5; h=6, 7, 8) of the second parity check matrix, at which the bit is set to "1". $Q_{g,h}$ also includes $MSB(q_{i,j})$.

<Initialization>

Firstly, the controller 40 executes an initialization process. In the initialization process, the controller 40 stores $\psi(p_j)$ and $sgn(p_j)$ into each memory unit of the memory 30. $p_j$ represents a logarithmic value of probability acquired from the output of the communication channel. Concerning all j values in the first parity check matrix, $\psi(p_j)$ is set as the initial value of each of $\psi(q_{i1,j})$, $\psi(q_{i2,j})$ and $\psi(q_{i3,j})$. Further, concerning all j values in the second parity check matrix, $\psi(p_j)$ is set as the initial value of each of $\psi(q_{i1,j})$, $\psi(q_{i2,j})$, $\psi(q_{i3,j})$, $\psi(q_{i4,j})$ and $\psi(q_{i5,j})$ $q_{i1,j}$, $q_{i2,j}$, $q_{i3,j}$, $q_{i4,j}$ and $q_{i5,j}$ represent parity information items $q_{i,j}$ (i=i1, i2, i3, i4, i5) corresponding to bit positions i1, i2, i3, i4 and i5 in the $j^{th}$ column of the check matrix H, at which the bit is set to "1". Further, in the initialization process, $sgn(p_j)$ is set as the initial value of each of $MSB(q_{i1,j})$, $MSB(q_{i2,j})$, $MSB(q_{i3,j})$, $MSB(q_{i4,j})$ and $MSB(q_{i5,j})$. The controller 40 also resets the registers 131 and 111a incorporated in each of the M bit processing units 10-1 to 10-M.

<First Cycle>

In the $1^{st}$ to $5^{th}$ cycles, processing is performed on the first parity check matrix. Firstly, in the $1^{st}$ cycle, the M bit processing units 10-1 to 10-M start addition processing. Specifically, $MSB(q_{i,j1})$ and $\psi(q_{i,j1})$ are stored into the registers 131 and 111a of each of the bit processing units 10-1 to 10-M, respectively. $q_{i,j1}$ represents parity information $q_{i,j}$ (j=j1) corresponding to bit positions j1 included in the bit positions j1 to j8 of the $i^{th}$ row of the check matrix H at which the bit is set to "1". Namely, $MSB(q_{i,j1})$ and $\psi(q_{i,j1})$ stored in the registers 131 and 111a of each of the bit processing units 10-1 to 10-M, respectively, correspond to the leftmost position j1 (the $1^{st}$ bit position) of the bit positions j1 to j8 in each ($i^{th}$) row of the first parity check matrix at which the bit is set to "1", and correspond to $Q_{1,1}$, $Q_{2,1}$ and $Q_{3,1}$ stored in the memory 30. The $1^{st}$ bit position ji belongs to the first column block.

<Second Cycle>

In the $2^{nd}$ cycle, the multiplexer 111b in the addition circuit 111 of each of the bit processing units 10-1 to 10-M selects $\psi(q_{i,j2})$. The addition circuit 111 performs addition processing, using $\psi(q_{i,j2})$. Specifically, the adder 111d of the addition circuit 111 adds up the value stored in the register 111a in the $1^{st}$ cycle, and $\psi(q_{i,j2})$ selected by the multiplexer 111b. The addition result of the adder 111d, i.e., the sum of the value $(\psi(q_{i,j1}))$ stored in the register 111a and $\psi(q_{i,j2})$, is stored into the register 111a. On the other hand, the sign computation circuit 130 of each of the bit processing units 10-1 to 10-M selects $MSB(q_{i,j2})$, using the multiplexer 132. In the $2^{nd}$ cycle, using $MSB(q_{i,j2})$, the exclusive-OR circuit 134 of the sign computation circuit 130 executes exclusive-OR computation. Namely, the exclusive-OR circuit 134 calculates the exclusive-OR of the value $(MSB(q_{i,j1}))$ stored in the register 131 in the $1^{st}$ cycle, and $MSB(q_{i,j2})$ selected by the multiplexer 132. The computation result of the exclusive-OR circuit 134, i.e., the exclusive-OR of the value stored in the register 131 and $MSB(q_{i,j2})$, is stored in the register 131. $MSB(q_{i,j2})$ and $\psi(q_{i,j2})$ correspond to the $2^{nd}$ bit position j2 (j=j2) included in the bit positions j1 to j8 in each ($i^{th}$) row of the check matrix H at which the bit is set to "1", and correspond to $Q_{1,2}$, $Q_{2,2}$ and $Q_{3,2}$ stored in the memory 30. The $2^{nd}$ bit position j2 belongs to the second column block.

<Third Cycle>

In the $3^{rd}$ cycle, the multiplexer 111*b* in the addition circuit 111 of each of the bit processing units 10-1 to 10-M selects $\psi(q_{i,j3})$. The addition circuit 111 performs addition processing, using $\psi(q_{i,j3})$. Specifically, the adder 111*d* of the addition circuit 111 adds up the value stored in the register 111*a* in the $2^{nd}$ cycle, and $\psi(q_{i,j3})$ selected by the multiplexer 111*b*. The addition result of the adder 111*d*, i.e., the sum of the value stored in the register 111*a* and $\psi(q_{i,j3})$, is stored into the register 111*a*. On the other hand, the sign computation circuit 130 of each of the bit processing units 10-1 to 10-M selects $MSB(q_{i,j3})$, using the multiplexer 132. In the $3^{rd}$ cycle, using $MSB(q_{i,j3})$, the exclusive-OR circuit 134 of the sign computation circuit 130 executes exclusive-OR computation. Namely, the exclusive-OR circuit 134 calculates the exclusive-OR of the value stored in the register 131 in the $2^{nd}$ cycle, and $MSB(q_{i,j3})$ selected by the multiplexer 132. The computation result of the exclusive-OR circuit 134, i.e., the exclusive-OR of the value stored in the register 131 and $MSB(q_{i,j3})$, is stored in the register 131. $MSB(q_{i,j3})$ and $\psi(q_{i,j3})$ correspond to the $3^{rd}$ bit position j3 (j=j3) included in the bit positions j1 to j8 in each ($i^{th}$) row of the check matrix H at which the bit is set to "1", and correspond to $Q_{1,3}$, $Q_{2,3}$ and $Q_{3,3}$ stored in the memory 30. The $3^{rd}$ bit position j3 belongs to the third column block.

<Fourth Cycle>

In the $4^{th}$ cycle, the multiplexer 111*b* in the addition circuit 111 of each of the bit processing units 10-1 to 10-M selects $\psi(q_{i,j4})$. The addition circuit 111 performs addition processing, using $\psi(q_{i,j4})$. Specifically, the adder 111*d* of the addition circuit 111 adds up the value stored in the register 111*a* in the $3^{rd}$ cycle, and $\psi(q_{i,j4})$ selected by the multiplexer 111*b*. The addition result of the adder 111*d*, i.e., the sum of the value stored in the register 111*a* and $\psi(q_{i,j4})$, is stored into the register 111*a*. On the other hand, the sign computation circuit 130 of each of the bit processing units 10-1 to 10-M selects $MSB(q_{i,j4})$, using the multiplexer 132. In the $4^{th}$ cycle, using $MSB(q_{i,j4})$, the exclusive-OR circuit 134 of the sign computation circuit 130 executes exclusive-OR computation. Namely, the exclusive-OR circuit 134 calculates the exclusive-OR of the value stored in the register 131 in the $3^{rd}$ cycle, and $MSB(q_{i,j4})$ selected by the multiplexer 132. The computation result of the exclusive-OR circuit 134, i.e., the exclusive-OR of the value stored in the register 131 and $MSB(q_{i,j4})$, is stored in the register 131. $MSB(q_{i,j4})$ and $\psi(q_{i,j4})$ correspond to the $4^{th}$ bit position j4 (j=j4) included in the bit positions j1 to j5 in each ($i^{th}$) row of the check matrix H at which the bit is set to "1", and correspond to $Q_{1,4}$, $Q_{2,4}$ and $Q_{3,4}$ stored in the memory 30. The $4^{th}$ bit position j4 belongs to the fourth column block.

<Fifth Cycle>

In the $5^{th}$ cycle, the multiplexer 111*b* in the addition circuit 111 of each of the bit processing units 10-1 to 10-M selects $\psi(q_{i,j5})$. The addition circuit 111 performs addition processing, using $\psi(q_{i,j5})$. Specifically, the adder 111*d* of the addition circuit 111 adds up the value stored in the register 111*a* in the $4^{th}$ cycle, and $\psi(q_{i,j5})$ selected by the multiplexer 111*b*. The addition result of the adder 111*d*, i.e., the sum of the value stored in the register 111*a* and $\psi(q_{i,j5})$, is stored into the register 111*a*. On the other hand, the sign computation circuit 130 of each of the bit processing units 10-1 to 10-M selects $MSB(q_{i,j5})$, using the multiplexer 132. In the $5^{th}$ cycle, using $MSB(q_{i,j5})$, the exclusive-OR circuit 134 of the sign computation circuit 130 executes exclusive-OR computation. Namely, the exclusive-OR circuit 134 calculates the exclusive-OR of the value stored in the register 131 in the $4^{th}$ cycle, and $MSB(q_{i,j5})$ selected by the multiplexer 132. The computation result of the exclusive-OR circuit 134, i.e., the exclusive-OR of the value stored in the register 131 and $MSB(q_{i,j5})$, is stored in the register 131. $MSB(q_{i,j5})$ and $\psi(q_{i,j5})$ correspond to the $5^{th}$ bit position j5 (j=j5) included in the bit positions j1 to j8 in each ($i^{th}$) row of the check matrix H at which the bit is set to "1", and correspond to $Q_{1,5}$, $Q_{2,5}$ and $Q_{3,5}$ stored in the memory 30. The $5^{th}$ bit position j5 belongs to the fifth column block.

<Sixth Cycle>

In the $6^{th}$ to $8^{th}$ cycles, processing is performed on the second parity check matrix. In the $6^{th}$ cycle, the M bit processing units 10-1 to 10-M start addition processing as in the process on the first parity check matrix. Specifically, $MSB(q_{i,j6})$ and $\psi(q_{i,j6})$ are stored into the registers 131 and 111*a* of each of the bit processing units 10-1 to 10-M, respectively. $q_{i,j6}$ represents parity information $q_{i,6}$ (j=j6) corresponding to bit positions j6 included in the bit positions j6 to j8 of the $i^{th}$ row of the check matrix H at which the bit is set to "1". Namely, $MSB(q_{i,j6})$ and $\psi(q_{i,j6})$ stored in the registers 131 and 111*a* of each of the bit processing units 10-1 to 10-M, respectively, correspond to the leftmost position j6 (the $6^{th}$ bit position) of the bit positions j6 to j8 in each ($i^{th}$) row of the first parity check matrix at which the bit is set to "1", and correspond to $Q_{1,6}$, $Q_{2,6}$, $Q_{3,6}$, $Q_{4,6}$ and $Q_{5,6}$ stored in the memory 30. The $6^{th}$ bit position j6 belongs to the first column block.

<Seventh Cycle>

In the $7^{th}$ cycle, the multiplexer 111*b* in the addition circuit 111 of each of the bit processing units 10-1 to 10-M selects $\psi(q_{i,j7})$. The addition circuit 111 performs addition processing, using $\psi(q_{i,j7})$. Specifically, the adder 111*d* of the addition circuit 111 adds up the value stored in the register 111*a* in the $6^{th}$ cycle, and $\psi(q_{i,j7})$ selected by the multiplexer 111*b*. The addition result of the adder 111*d*, i.e., the sum of the value ($\psi(q_{i,j6})$) stored in the register 111*a* and $\psi(q_{i,j7})$, is stored into the register 111*a*. On the other hand, the sign computation circuit 130 of each of the bit processing units 10-1 to 10-M selects $MSB(q_{i,j7})$, using the multiplexer 132. In the $7^{th}$ cycle, using $MSB(q_{i,j7})$, the exclusive-OR circuit 134 of the sign computation circuit 130 executes exclusive-OR computation. Namely, the exclusive-OR circuit 134 calculates the exclusive-OR of the value ($MSB(q_{i,j6})$) stored in the register 131 in the $6^{th}$ cycle, and $MSB(q_{i,j7})$ selected by the multiplexer 132. The computation result of the exclusive-OR circuit 134, i.e., the exclusive-OR of the value stored in the register 131 and $MSB(q_{i,j7})$, is stored in the register 131. $MSB(q_{i,j7})$ and $\psi(q_{i,j7})$ correspond to the $7^{th}$ bit position j7 (j=j7) included in the bit positions j1 to j8 in each ($i^{th}$) row of the check matrix H at which the bit is set to "1", and correspond to $Q_{1,7}$, $Q_{2,7}$, $Q_{3,7}$, $Q_{4,7}$ and $Q_{5,7}$ stored in the memory 30. The $7^{th}$ bit position j7 belongs to the second column block.

<Eighth Cycle>

In the $8^{th}$ cycle, the multiplexer 111*b* in the addition circuit 111 of each of the bit processing units 101 to 10-M selects $\psi(q_{i,j8})$. The addition circuit 111 performs addition processing, using $\psi(q_{i,j8})$. Specifically, the adder 111*d* of the addition circuit 111 adds up the value stored in the register 111*a* in the $7^{th}$ cycle, and $\psi(q_{i,j8})$ selected by the multiplexer 111*b*. The addition result of the adder 111*d*, i.e., the sum of the value stored in the register 111*a* and $\psi(q_{i,j8})$, is stored into the register 111*a*. On the other hand, the sign computation circuit 130 of each of the bit processing units 10-1 to 10-M selects $MSB(q_{i,j8})$, using the multiplexer 132. In the $8^{rd}$ cycle, using $MSB(q_{i,j8})$, the exclusive-OR circuit 134 of the sign computation circuit 130 executes exclusive-OR computation. Namely, the exclusive-OR circuit 134 calculates the exclusive-OR of the value stored in the register 131 in the $7^{th}$ cycle, and MSB($q_{i,j8}$) selected by the multiplexer 132. The computation result of the exclusive-OR circuit 134, i.e., the exclusive-OR of the value stored in the register 131 and MSB($q_{i,j8}$), is stored in the register 131. MSB($q_{i,j8}$) and $\psi(q_{i,j8})$ correspond to the $8^{th}$ bit position j8 (j=j8) included in the bit positions j1 to j8 in each ($i^{th}$) row of the check matrix H at which the bit is set to "1", and correspond to $Q_{1,8}$, $Q_{2,8}$, $Q_{3,8}$, $Q_{4,8}$ and $Q_{5,8}$ stored in the memory 30. The $8^{th}$ bit position j8 belongs to the third column block.

<Ninth Cycle>

In the $9^{th}$ cycle, the subtraction circuit 112 of each of the bit processing units 10-1 to 10-M starts a subtraction process. The subtraction process utilizes the final result of the addition process held in one of the registers 111a in each bit processing unit 10-i (i=1, 2, ..., M), and $Q_{1,1}$, $Q_{2,1}$ and $Q_{3,1}$ stored in the memory 30. The final result means the sum of $\psi(q_{i,j})$ values corresponding to positions in the $i^{th}$ row of the check matrix H, at which the bit is set to "1". In the subtraction process, $\psi(q_{i,j1})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j1})$. After that, the subtracter 112c of the subtraction circuit 112 subtracts $\psi(q_{i,j1})$ selected by the multiplexer 112a from the final result of the addition process selected by the multiplexer 112b.

On the other hand, the sign computation circuit 130 of each of the bit processing units 10-1 to 10-M excludes MSB($q_{i,j1}$) from the final result of the exclusive-OR computation. To this end, the multiplexer 136 in the sign computation circuit 130 selects the one of the registers 131 that holds the final result of the exclusive-OR computation. The final result of the exclusive-OR computation means the exclusive-ORs of MSB($q_{i,j}$) values corresponding to positions j in the $i^{th}$ row of the check matrix H, at which the bit is set to "1". Further, the multiplexer 135 in the sign computation circuit 130 selects MSB($q_{i,j1}$). After that, the exclusive-OR circuit 137 of the sign computation circuit 130 acquires the exclusive-OR of the final result of the exclusive-OR computation selected by the multiplexer 136 and MSB($q_{i,j1}$) selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $9^{th}$ cycle, $R_{1,1}$, $R_{2,1}$ and $R_{3,1}$ are generated and stored in the memory 30 ((B) in FIG. 6). $R_{1,1}$, $R_{2,1}$ and $R_{3,1}$ represent a set of $r_{i,j}$ values corresponding to the bit positions in the permuted matrices $I_{1,1}$, $I_{2,1}$ and $I_{3,1}$, which correspond to the $1^{st}$ to $(p1)^{th}$ columns (of the first column block) included in the first parity check matrix, and at which the bit is set to "1".

<Tenth Cycle>

In the $10^{th}$ cycle, the subtraction circuit 112 of each of the bit processing units 10-1 to 10-M starts a subtraction process. The subtraction process utilizes the final result of the addition process held in one of the registers 111a in each bit processing unit 10-i (i=1, 2, ..., M), and $Q_{1,2}$, $Q_{2,2}$ and $Q_{3,2}$ stored in the memory 30. The final result means the sum of $\psi(q_{i,j})$ values corresponding to positions in the $i^{th}$ row of the check matrix H, at which the bit is set to "1". In the subtraction process, $\psi(q_{i,j2})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j2})$. After that, the subtracter 112c of the subtraction circuit 112 subtracts $\psi(q_{i,j2})$ selected by the multiplexer 112a from the final result of the addition process selected by the multiplexer 112b.

On the other hand, the sign computation circuit 130 of each of the bit processing units 10-1 to 10-M excludes MSB($q_{i,j2}$) from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects MSB($q_{i,j2}$). After that, the exclusive-OR circuit 137 of the sign computation circuit 130 acquires the exclusive-OR of the final result of the exclusive-OR computation selected by the multiplexer 136 and MSB($q_{i,j2}$) selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $7^{th}$ cycle, $R_{1,2}$, $R_{2,2}$ and $R_{3,2}$ are generated and stored in the memory 30 ((C) in FIG. 6). $R_{1,2}$, $R_{2,2}$ and $R_{3,2}$ represent a set of $r_{i,j}$ values corresponding to the bit positions in the permuted matrices $I_{1,2}$, $I_{2,2}$ and $I_{3,2}$ corresponding to the $(p1+1)^{th}$ to $2(p1)^{th}$ columns of the first parity check matrix, at which the bit is set to "1".

In the $10^{th}$ cycle, each element $r_{i,j}$ in $R_{1,1}$, $R_{2,1}$ and $R_{3,1}$ stored in the memory 30 in the $9^{th}$ cycle can be utilized. Accordingly, in the $10^{th}$ cycle, the parity processing units 20-1 to 20-m start parity update computation under the control of the controller 40, utilizing each element $r_{i,j}$ in $R_{1,1}$, $R_{2,1}$ and $R_{3,1}$. As a result, concerning each of the $1^{st}$ to $(p1)^{th}$ columns (of the first column block) included in the first parity check matrix, $\psi(q_{i1,j})$, $\psi(q_{i2,j})$ and $\psi(q_{i3,j})$, MSB($q_{i1,j}$), MSB($q_{i2,j}$) and MSB($q_{i3,j}$), and $q_j$ are acquired. Using $\psi(q_{i1,j})$, $\psi(q_{i2,j})$ and $\psi(q_{i3,j})$, MSB($q_{i1,j}$), MSB($q_{i2,j}$) and MSB($q_{i3,j}$), and $q_j$ acquired concerning each of the $1^{st}$ to $(p1)^{th}$ columns of the check matrix H, $Q_{1,1}$, $Q_{2,1}$ and $Q_{3,1}$ stored in the memory 30 are updated to $Q'_{1,1}$, $Q'_{2,1}$ and $Q'_{3,1}$ ((C) in FIG. 6).

Thus, in the embodiment, parity update computation can be started before bit update computation corresponding to all bits in each of the $1^{st}$ to $M^{th}$ rows of the first parity check matrix is finished. Namely, in the embodiment, parity update computation can be started when only bit update computation is finished which corresponds to each bit position in the permuted matrices $I_{1,1}$, $I_{2,1}$ and $I_{3,1}$ (of the first column block)_included in the first parity check matrix, at which the bit is set to "1". In other words, in the embodiment, bit update computation and parity update computation can be processed using a pipeline.

<Eleventh Cycle>

In the $11^{th}$ cycle, each element $q_{i,j}$ in updated $Q'_{1,1}$, $Q'_{2,1}$ and $Q'_{3,1}$ can be utilized. Accordingly, in the $11^{th}$ cycle, the bit processing units 10-1 to 10-M start next bit update computation under the control of the controller 40, thereby performing the same addition process as in the $1^{st}$ cycle. However, the result of the addition process is held by the register 111a other than the register 111a used to hold the result of the addition process of the $1^{st}$ cycle (to $8^{th}$ cycles).

Thus, in the embodiment, bit update computation can be started before parity update computation corresponding to all bits in each of the $1^{st}$ to $N^{th}$ columns of the first parity check matrix is finished. Namely, in the embodiment, next bit update computation can be started when only parity update computation is finished which corresponds to each bit position in the permuted matrices $I_{1,1}$, $I_{2,1}$ and $I_{3,1}$ (of the first column block) included in the first parity check matrix (i.e., when parity update computation has been performed concerning the first m columns of the check matrix H). In other words, the combination of bit update computation and parity update computation can be iterated using a pipeline.

Further, in the $11^{th}$ cycle, a subtraction process by the bit processing units 10-1 to 10-M is executed in parallel with the above addition process. In the subtraction process, the final result of the addition process held by the one of the register 111a in each of the bit processing unit 10-1 to 10-M, and $Q_{1,3}$, $Q_{2,3}$ and $Q_{3,3}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j3})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j3})$. After that, the subtracter 112c of the subtraction circuit 112 subtracts $\psi(q_{i,j3})$ selected by the multiplexer 112a from the final result of the addition process selected by the multiplexer 112b.

On the other hand, the sign computation circuit 130 of each of the bit processing units 10-1 to 10-M excludes $MSB(q_{i,j3})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j3})$. After that, the exclusive-OR circuit 137 of the sign computation circuit 130 acquires the exclusive-OR of the final result of the exclusive-OR computation selected by the multiplexer 136 and $MSB(q_{i,j3})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $11^{th}$ cycle, $R_{1,3}$, $R_{2,3}$ and $R_{3,3}$ are generated and stored in the memory 30 ((D) in FIG. 6). $R_{1,3}$, $R_{2,3}$ and $R_{3,3}$ represent a set of $r_{i,j}$ values corresponding to the bit positions in the permuted matrices $I_{1,3}$, $I_{2,3}$ and $I_{3,3}$, which correspond to the $(2(p1)+1)^{th}$ to $3(p1)^{th}$ columns (of the third column block) included in the check matrix H, and at which the bit is set to "1".

Furthermore, in the $11^{th}$ cycle, the parity processing units 20-1 to 20-m perform parity update computation, utilizing each element $r_{i,j}$ in $R_{1,2}$, $R_{2,2}$ and $R_{3,2}$ stored in the memory 30 in the $10^{th}$ cycle. As a result, $Q_{1,2}$, $Q_{2,2}$ and $Q_{3,2}$ stored in the memory 30 are updated to $Q'_{1,2}$, $Q'_{2,2}$ and $Q'_{3,2}$ ((D) in FIG. 6).

<Twelfth Cycle>

In the $12^{th}$ cycle, the bit processing units 10-1 to 10-M perform the same addition process as in the $2^{nd}$ cycle, using $Q'_{1,2}$, $Q'_{2,2}$ and $Q'_{3,2}$.

Further, in the $12^{th}$ cycle, the bit processing units 10-1 to 10-M perform a subtraction process in parallel with the addition process. In the subtraction process, the final result of the addition process held by the one of the register 111a in each bit processing unit 10-i (i=1, 2, ..., M), and $Q_{1,4}$, $Q_{2,4}$ and $Q_{3,4}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j4})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j4})$. After that, the subtracter 112c of the subtraction circuit 112 subtracts $\psi(q_{i,j4})$ selected by the multiplexer 112a from the final result of the addition process selected by the multiplexer 112b.

On the other hand, the sign computation circuit 130 of each of the bit processing units 10-1 to 10-M excludes $MSB(q_{i,j4})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j4})$. After that, the exclusive-OR circuit 137 of the sign computation circuit 130 acquires the exclusive-OR of the final result of the exclusive-OR computation selected by the multiplexer 136 and $MSB(q_{i,j4})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $12^{th}$ cycle, $R_{1,4}$, $R_{2,4}$ and $R_{3,4}$ are generated and stored in the memory 30 ((E) in FIG. 6). $R_{1,4}$, $R_{2,4}$ and $R_{3,4}$ represent a set of $r_{i,j}$ values corresponding to the bit positions in the permuted matrices $I_{1,4}$, $I_{2,4}$ and $I_{3,4}$, which correspond to the $(3(p1)+1)^{th}$ to $4(p1)^{th}$ columns (of the fourth column block) included in the check matrix H, and at which the bit is set to "1".

Furthermore, in the $12^{th}$ cycle, the parity processing units 20-1 to 20-m perform parity update computation, utilizing each element $r_{i,j}$ in $R_{1,3}$, $R_{2,3}$ and $R_{3,3}$ stored in the memory 30 in the $11^{th}$ cycle. As a result, $Q_{1,3}$, $Q_{2,3}$ and $Q_{3,3}$ stored in the memory 30 are updated to $Q'_{1,3}$, $Q'_{2,3}$ and $Q'_{3,3}$ ((E) in FIG. 6).

<Thirteenth Cycle>

In the $13^{th}$ cycle, the bit processing units 10-1 to 10-M perform the same addition process as in the $3^{rd}$ cycle, using $Q'_{1,3}$, $Q'_{2,3}$ and $Q'_{3,3}$.

Further, in the $13^{th}$ cycle, the bit processing units 10-1 to 10-M perform a subtraction process in parallel with the addition process. In the subtraction process, the final result of the addition process held by the one of the register 111a in each bit processing unit 10-i (i=1, 2, ..., M), and $Q_{1,5}$, $Q_{2,5}$ and $Q_{3,5}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j5})$ is subtracted from the final result of the addition process. To this end, the multiplexer 112b of the subtraction circuit 112 selects the one of the registers 111a that holds the final result of the addition process. The multiplexer 112a of the subtraction circuit 112 selects $\psi(q_{i,j5})$. After that, the subtracter 112c of the subtraction circuit 112 subtracts $\psi(q_{i,j5})$ selected by the multiplexer 112a from the final result of the addition process selected by the multiplexer 112b.

On the other hand, the sign computation circuit 130 of each of the bit processing units 10-1 to 10-M excludes $MSB(q_{i,j5})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j5})$. After that, the exclusive-OR circuit 137 of the sign computation circuit 130 acquires the exclusive-OR of the final result of the exclusive-OR computation selected by the multiplexer 136 and $MSB(q_{i,j5})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $13^{th}$ cycle, $R_{1,5}$, $R_{2,5}$ and $R_{3,5}$ are generated and stored in the memory 30 ((F) in FIG. 7). $R_{1,5}$, $R_{2,5}$ and $R_{3,5}$ represent a set of $r_{i,j}$ values corresponding to the bit positions in the permuted matrices $I_{1,5}$, $I_{2,5}$ and $I_{3,5}$, which correspond to the $(4(p1)+1)^{th}$ to $5(p1)^{th}$ ($N^{th}$) columns (of the fifth column block) included in the check matrix H, and at which the bit is set to "1".

Furthermore, in the $13^{th}$ cycle, the parity processing units 20-1 to 20-$m$ perform parity update computation, utilizing each element $r_{i,j}$ in $R_{1,4}$, $R_{2,4}$ and $R_{3,4}$ stored in the memory 30 in the $12^{th}$ cycle. As a result, $Q_{1,4}$, $Q_{2,4}$ and $Q_{3,4}$ stored in the memory 30 are updated to $Q'_{1,4}$, $Q'_{2,4}$ and $Q'_{3,4}$ ((F) in FIG. 7).

<Fourteenth Cycle>

In the $14^{th}$ cycle, the bit processing units 10-1 to 10-M perform the same addition process as in the $4^{th}$ cycle, using $Q'_{1,4}$, $Q'_{2,4}$ and $Q'_{3,4}$.

Further, in the $14^{th}$ cycle, in parallel with the addition process, each of the bit processing units 10-1 to 10-M starts a subtraction process. The subtraction process utilizes the final result of the addition process held in one of the registers 111$a$ in each bit processing unit 10-$i$ ($i$=1, 2, ..., M), and $Q_{1,6}$, $Q_{2,6}$, $Q_{3,6}$, $Q_{4,6}$ and $Q_{5,6}$ stored in the memory 30. The final result means the sum of $\psi(q_{i,j})$ values corresponding to positions in the $i^{th}$ row of the check matrix H, at which the bit is set to "1". In this subtraction process, $\psi(q_{i,j6})$ is subtracted from the final result of the addition process. To this end, the multiplexer 112$b$ of the subtraction circuit 112 selects the one of the registers 111$a$ that holds the final result of the addition process. The multiplexer 112$a$ of the subtraction circuit 112 selects $\psi(q_{i,j6})$. After that, the subtracter 112$c$ of the subtraction circuit 112 subtracts $\psi(q_{i,j6})$ selected by the multiplexer 112$a$ from the final result of the addition process selected by the multiplexer 112$b$.

On the other hand, the sign computation circuit 130 of each of the bit processing units 10-1 to 10-M excludes MSB($q_{i,j6}$) from the final result of the exclusive-OR computation. To this end, the multiplexer 136 in the sign computation circuit 130 selects the one of the registers 131 that holds the final result of the exclusive-OR computation. The final result of the exclusive-OR computation means the exclusive-ORs of MSB($q_{i,j}$) values corresponding to positions j in the $i^{th}$ row of the check matrix H, at which the bit is set to "1". Further, the multiplexer 135 in the sign computation circuit 130 selects MSB($q_{i,j6}$). After that, the exclusive-OR circuit 137 of the sign computation circuit 130 acquires the exclusive-OR of the final result of the exclusive-OR computation selected by the multiplexer 136 and MSB($q_{i,j6}$) selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $14^{th}$ cycle, $R_{1,6}$, $R_{2,6}$, $R_{3,6}$, $R_{4,6}$ and $R_{5,6}$ are generated and stored in the memory 30 ((G) in FIG. 7). $R_{1,6}$, $R_{2,6}$, $R_{3,6}$, $R_{4,6}$ and $R_{5,6}$ represent a set of $r_{i,j}$ values corresponding to the bit positions in the permuted matrices $I_{1,6}$, $I_{2,6}$, $I_{3,6}$, $I_{4,6}$ and $I_{5,6}$, which correspond to the $(5(p1)+1)^{th}$ to $(5(p1)+p2)^{th}$ columns (of the first column block) included in the first parity check matrix, and at which the bit is set to "1".

Further, in the $14^{th}$ cycle, the parity processing units 20-1 to 20-$m$ perform parity update computation, utilizing each element $r_{i,j}$ in $R_{1,5}$, $R_{2,5}$ and $R_{3,5}$ stored in the memory 30 in the $13^{th}$ cycle. As a result, $Q_{1,5}$, $Q_{2,5}$ and $Q_{3,5}$ stored in the memory 30 are updated to $Q'_{1,5}$, $Q'_{2,5}$ and $Q'_{3,5}$ ((G) in FIG. 7).

<Fifteenth Cycle>

In the $15^{th}$ cycle, the bit processing units 10-1 to 10-M performs the same addition process as in the $5^{th}$ cycle, using $Q'_{1,5}$, $Q'_{2,5}$ and $Q'_{3,5}$.

Further, in the $15^{th}$ cycle, the bit processing units 10-1 to 10-M execute a subtraction process in parallel with the above addition process. In the subtraction process, the final result of the addition process held by the one of the register 111$a$ in each of the bit processing unit 10-1 to 10-M, and $Q_{1,7}$, $Q_{2,7}$, $Q_{3,7}$, $Q_{4,7}$ and $Q_{5,7}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j7})$ is subtracted from the final result of the addition process. To this end, the multiplexer 112$b$ of the subtraction circuit 112 selects the one of the registers 111$a$ that holds the final result of the addition process. The multiplexer 112$a$ of the subtraction circuit 112 selects $\omega(q_{i,j7})$. After that, the subtracter 112$c$ of the subtraction circuit 112 subtracts $\psi(q_{i,j7})$ selected by the multiplexer 112$a$ from the final result of the addition process selected by the multiplexer 112$b$.

On the other hand, the sign computation circuit 130 of each of the bit processing units 10-1 to 10-M excludes MSB($q_{i,j7}$) from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects MSB($q_{i,j7}$). After that, the exclusive-OR circuit 137 of the sign computation circuit 130 acquires the exclusive-OR of the final result of the exclusive-OR computation selected by the multiplexer 136 and MSB($q_{i,j7}$) selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $15^{th}$ cycle, $R_{1,7}$, $R_{2,7}$, $R_{3,7}$, $R_{4,7}$ and $R_{5,7}$ are generated and stored in the memory 30 ((H) in FIG. 7). $R_{1,7}$, $R_{2,7}$, $R_{3,7}$, $R_{4,7}$ and $R_{5,7}$ represent a set of $r_{i,j}$ values corresponding to the bit positions in the permuted matrices $I_{1,7}$, $I_{2,7}$, $I_{3,7}$, $I_{4,7}$ and $I_{5,7}$, which correspond to the $(5(p1)+2p+1)^{th}$ to $(5(p1)+2(2p))^{th}$ columns (of the third column block) included in the check matrix H, and at which the bit is set to "1".

Furthermore, in the $15^{th}$ cycle, the parity processing units 20-1 to 20-$m$ perform parity update computation, utilizing each element $r_{i,j}$ in $R_{1,6}$, $R_{2,6}$, $R_{3,6}$, $R_{4,6}$ and $R_{5,6}$ stored in the memory 30 in the $14^{th}$ cycle. As a result, $Q_{1,6}$, $Q_{2,6}$, $Q_{3,6}$, $Q_{4,6}$ and $Q_{5,6}$ stored in the memory 30 are updated to $Q'_{1,6}$, $Q'_{2,6}$, $Q'_{3,6}$, $Q'_{4,6}$ and $Q'_{5,6}$ ((H) in FIG. 7).

<Sixteenth Cycle>

In the $16^{th}$ cycle, the bit processing units 10-1 to 10-M performs the same addition process as in the $6^{th}$ cycle, using $Q'_{1,6}$, $Q'_{2,6}$, $Q'_{3,6}$, $Q'_{4,6}$ and $Q'_{5,6}$.

Further, in the $16^{th}$ cycle, the bit processing units 10-1 to 10-M execute a subtraction process in parallel with the above addition process. In the subtraction process, the final result of the addition process held by the one of the register 111$a$ in each of the bit processing unit 10-1 to 10-M, and $Q_{1,8}$, $Q_{2,8}$, $Q_{3,8}$, $Q_{4,8}$ and $Q_{5,8}$ stored in the memory 30 are used. The final result of the addition process means the sum of $\psi(q_{i,j})$ values corresponding to positions in the $i^{th}$ row of the check matrix H, at which the bit is set to "1". In the subtraction process, $\psi(q_{i,j8})$ is subtracted from the final result of the addition process. To this end, the multiplexer 112$b$ of the subtraction circuit 112 selects the one of the registers 111$a$ that holds the final result of the addition process. The multiplexer 112a of the subtraction circuit 112 selects $\psi(q_{i,j8})$. After that, the subtracter 112c of the subtraction circuit 112 subtracts $\psi(q_{i,j8})$ selected by the multiplexer 112a from the final result of the addition process selected by the multiplexer 112b.

On the other hand, the sign computation circuit 130 of each of the bit processing units 10-1 to 10-M excludes $MSB(q_{i,j8})$ from the final result of the exclusive-OR computation. To this end, the multiplexer 136 in the sign computation circuit 130 selects the one of the registers 131 that holds the final result of the exclusive-OR computation. Further, the multiplexer 135 in the sign computation circuit 130 selects $MSB(q_{i,j8})$. After that, the exclusive-OR circuit 137 of the sign computation circuit 130 acquires the exclusive-OR of the final result of the exclusive-OR computation selected by the multiplexer 136 and $MSB(q_{i,j8})$ selected by the multiplexer 135. In accordance with the computation result of the exclusive-OR circuit 137, the sign of information output from the multiplexer 138 is determined, whereby bit information $r_{i,j}$ is acquired. The bit information $r_{i,j}$ is stored in the memory 30 at a position determined from the $i^{th}$ row and $j^{th}$ column corresponding to the bit information $r_{i,j}$. In the $16^{th}$ cycle, $R_{1,8}$, $R_{2,8}$, $R_{3,8}$, $R_{4,8}$ and $R_{5,8}$ are generated and stored in the memory 30 ((I) in FIG. 7). $R_{1,8}$, $R_{2,8}$, $R_{3,8}$, $R_{4,8}$ and $R_{5,8}$ represent a set of $r_{i,j}$ values corresponding to the bit positions in the permuted matrices $I_{1,8}$, $I_{2,8}$, $I_{3,8}$, $I_{4,8}$ and $I_{5,8}$, which correspond to the $(5(p1)+2(p2)+1)^{th}$ to $(5(p1)+3(p2))^{th}$ columns (of the third) column block) included in the check matrix H, and at which the bit is set to "1".

Furthermore, in the $16^{th}$ cycle, the parity processing units 20-1 to 20-m perform parity update computation, utilizing each element $r_{i,j}$ in $R_{1,7}$, $R_{2,7}$, $R_{3,7}$, $R_{4,7}$ and $R_{5,7}$ stored in the memory 30 in the $15^{th}$ cycle. As a result, $Q_{1,7}$, $Q_{2,7}$, $Q_{3,7}$, $Q_{4,7}$ and $Q_{5,7}$ stored in the memory 30 are updated to $Q'_{1,7}$, $Q'_{2,7}$, $Q'_{3,7}$, $Q'_{4,7}$ and $Q'_{5,7}$ ((I) in FIG. 7).

<Seventeenth Cycle>

In the $17^{th}$ cycle, the bit processing units 10-1 to 10-M performs the same addition process as in the $7^{th}$ cycle, using $Q'_{1,7}$, $Q'_{2,7}$, $Q'_{3,7}$, $Q'_{4,7}$ and $Q'_{5,7}$.

Further, in the $17^{th}$ cycle, the parity processing units 20-1 to 20-m perform parity update computation using each element $r_{i,j}$ in $R_{1,7}$, $R_{2,7}$, $R_{3,7}$, $R_{4,7}$ and $R_{5,7}$ stored in the memory 30 in the $16^{th}$ cycle. As a result, $Q_{1,8}$, $Q_{2,8}$, $Q_{3,8}$, $Q_{4,8}$ and $Q_{5,8}$ stored in the memory 30 are updated to $Q'_{1,8}$, $Q'_{2,8}$, $Q'_{3,8}$, $Q'_{4,8}$ and $Q'_{5,8}$.

As described above, in the embodiment, bit update of all "1" bits in each of the $1^{st}$ to $M^{th}$ rows of the parity check matrix H can be executed in 16 cycles, i.e., (2(n1)+2(n2)) cycles.

In the $18^{th}$ cycle, et seq., the same operations as those performed in the $12^{th}$ cycle, et seq., are performed. Note that iteration of bit update computation and parity update computation is performed until a hard decision value, which is determined based on a certain number of $q_j$ values corresponding to each of all columns j (j=1, 2, ..., N) of the check matrix H, satisfies the $j^{th}$ parity-check equation. The certain number of $q_j$ values is m1 (=3) in the first parity check matrix, and is m2 (=5) in the second parity check matrix. However, if at least one column that does not satisfy the parity-check equation exists even after the iteration operation is performed a predetermined number of times, it is determined that decoding of the irregular LDPC code has failed, whereby the decoding operation is forcibly terminated.

In the above-described embodiment, each parity processing unit 20-k is configured to simultaneously perform parity update computation concerning all positions ($i^{th}$ row position) in the $j^{th}$ column of the check matrix H, using corresponding $r_{i,j}$. However, a parity processing unit that has the same structure as each bit processing unit 10-i may be employed instead of each parity processing unit 20-k. Namely, parity information $q_{i,j}$ corresponding to the $i^{th}$ row position in the $j^{th}$ column of the check matrix H can be sequentially updated by an addition process and subtraction process in two cycles. In this case, it is sufficient if only a single lookup table is provided at the output side of the parity processing unit. However, the number of cycles necessary for parity update computation is double the number of cycles in the case of using the parity processing unit 20-k. Further, the start time of bit update computation is delayed by one cycle.

In addition, in the above embodiment, the check matrix H has an array structure formed of (3×5) first permuted matrices and (5×3) second permuted matrices. However, the arrangement of the permuted matrices in the check matrix H is not limited to the above. It is sufficient if the check matrix H is formed of first and second parity check matrices connected to each other, the first parity check matrix being formed of (n1×m1) permuted matrices each including an array of (p1× p1), the second parity check matrix being formed of (n2×m2) permuted matrices each including an array of (p2×p2), (p1× n1) being equal to (p2×n2).

While certain embodiments of the inventions have been described, these embodiments have been presented by way of example only, and are not intended to limit the scope of the inventions. Indeed, the novel methods and systems described herein may be embodied in variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An irregular low-density parity-check code decoder comprising:

(p1×m1) bit processing units configured to perform bit update computation for sequentially updating bit information corresponding to column positions included in respective rows of a first parity-check matrix and a second parity-check matrix, the first and second parity-check matrices being arranged adjacent to each other, the first parity-check matrix being formed of (m1×n1) first permuted matrices and divided into n1 column blocks, each of the first permuted matrices having an array of (p1×p1), the second parity-check matrix being formed of (m2×n2) second permuted matrices and divided into n2 column blocks, each of the second permuted matrices having an array of (p2×p2)(p1>p2), a bit at each of the column positions being set to "1";

p1 parity processing units configured to perform parity update computation for updating parity information corresponding to row positions in p1 columns of each of the n1 column blocks of the first parity-check matrix, a bit at each of the row positions being set to "1", p2 parity processing units included in the p1 parity processing units being configured to perform parity update computation for updating parity information corresponding to row positions in p2 columns of each of the n2 column blocks of the second parity-check matrix, a bit at each of the row positions being set to "1"; and a controller configured to cause, whenever the (p1×m1) bit processing units have finished bit update computation for p1 column positions in the respective rows of the first parity-check matrix, the p1 parity processing units to perform parity update computation corresponding to p1 columns of one of the n1 column blocks to which the p1 column positions belong, the controller being configured to cause, after the p1 parity processing units finish parity update computation for p1 columns of a first one of the n1 column blocks, the (p1×m1) bit processing units to start next bit update computation, the controller being configured to cause, whenever (p2×m2) bit processing units have finished bit update computation for p2 column positions in the respective rows of the second parity-check matrix, the p2 parity processing units to perform parity update computation corresponding to p2 columns of one of the n2 column blocks to which the p2 column positions belong, the controller being configured to cause, after the p2 parity processing units finish parity update computation for p2 columns of a first one of the n2 column blocks, the (p2×m2) bit processing units to start next bit update computation.

2. The irregular low-density parity-check code decoder according to claim 1, wherein the first parity-check matrix and the second parity-check matrix satisfy a condition of p1×m1=p2×m2.

3. The irregular low-density parity-check code decoder according to claim 1, wherein:
an array (m1×n1) of the (m1×n1) permuted matrices of the first parity-check matrix satisfies a condition that m1 is smaller than n1;
each of the p1 parity processing units simultaneously receives bit information corresponding to m1 row positions in a corresponding one of the p1 columns of each of the n1 column blocks, a bit at each of the m1 row positions being set to "1", and updates parity information corresponding to the m1 row positions, based on the bit information corresponding to the m1 row positions;
an array (m2×n2) of the (m2×n2) permuted matrices of the second parity-check matrix satisfies a condition that n2 is smaller than m2; and
each of the p1 parity processing units simultaneously receives bit information corresponding to m2 row positions in a corresponding one of the p2 columns of each of the n2 column blocks, a bit at each of the m2 row positions being set to "1", and updates parity information corresponding to the m2 row positions, based on the bit information corresponding to the m2 row positions.

4. An irregular low-density parity-check code decoder comprising:
(p1×m1) bit processing units configured to perform bit update computation for sequentially updating bit information corresponding to column positions included in respective rows of a first parity-check matrix and a second parity-check matrix, the first and second parity-check check matrices being arranged adjacent to each other, the first parity-check matrix being formed of (m1×n1) first permuted matrices and divided into n1 column blocks, each of the first permuted matrices having an array of (p1×p1), the second parity-check matrix being formed of (m2×n2) second permuted matrices and divided into n2 column blocks, each of the second permuted matrices having an array of (p2×p2)(p1>p2), a bit at each of the column positions being set to "1";
p1 parity processing units configured to perform parity update computation for updating parity information corresponding to row positions in p1 columns of each of the n1 column blocks of the first parity-check matrix, a bit at each of the row positions being set to "1", p2 parity processing units included in the p1 parity processing units being configured to perform parity update computation for updating parity information corresponding to row positions in p2 columns of each of the n2 column blocks of the second parity-check matrix, a bit at each of the row positions being set to "1"; and a controller configured to cause, whenever the (p1×m1) bit processing units have finished bit update computation for p1 column positions in the respective rows of the first parity-check matrix, the p1 parity processing units to perform parity update computation corresponding to p1 columns of one of the n1 column blocks to which the p1 column positions belong, the controller being configured to cause, after the p1 parity processing units finish parity update computation for p1 columns of a first one of the n1 column blocks, the (p1×m1) bit processing units to start next bit update computation, the controller being configured to cause, whenever (p2×m2) bit processing units have finished bit update computation for p2 column positions in the respective rows of the second parity-check matrix, the p2 parity processing units to perform parity update computation corresponding to p2 columns of one of the n2 column blocks to which the p2 column positions belong, the controller being configured to cause, after the p2 parity processing units finish parity update computation for p2 columns of a first one of the n2 column blocks, the (p2×m2) bit processing units to start next bit update computation, wherein each of the (p1×m1) bit processing units includes an addition circuit and a subtraction circuit, the addition circuit being configured to perform an addition process for sequentially adding up parity information values corresponding to column positions in one of the rows of the parity-check matrix, thereby acquiring a sum of the parity information values, a bit at each of the column positions being set to "1", a subtraction circuit being configured to sequentially perform subtractions for subtracting, from the sum calculated by the addition circuit, the respective parity information values used for the addition process.

5. The irregular low-density parity-check code decoder according to claim 4, wherein the first parity-check matrix and the second parity-check matrix satisfy a condition of p1×m1=p2×m2.

6. The irregular low-density parity-check code decoder according to claim 4, wherein:
whenever the subtraction circuit included in each of the (p1×m1) bit processing units has finished subtractions for p1 column positions in the respective rows of the first parity-check matrix, the controller determines that the bit update computation for p1 columns of one of the n1 column blocks, to which the p1 column positions belong, has finished, and causes the p1 parity processing units to perform parity update computation corresponding to the p1 columns of the one of the n1 column blocks; and
whenever the subtraction circuit included in each of the (p1×m1) bit processing units has finished subtractions for p2 column positions in the respective rows of the second parity-check matrix, the controller determines that the bit update computation for p2 columns of one of the n2 column blocks, to which the p2 column positions belong, has finished, and causes the p2 parity processing units to perform parity update computation corresponding to the p2 columns of the one of the n2 column blocks.

7. The irregular low-density parity-check code decoder according to claim 4, wherein:
the addition circuit included in each of the (p1×m1) bit processing units includes:

a first multiplexer which sequentially selects parity information values corresponding to column positions in a corresponding one of the rows of the parity-check matrix, a bit at each of the column positions being set to "1"; and an adder which calculates a sum of parity information values sequentially selected by the first multiplexer, and the subtraction circuit included in each of the (p1×m1) bit processing units includes:

a second multiplexer which sequentially selects parity information values corresponding to column positions in a corresponding one of the rows of the parity-check matrix, a bit at each of the column positions being set to "1"; and a subtracter which subtracts, from the sum calculated by the adder, a parity information value selected by the second multiplexer.

8. The irregular low-density parity-check code decoder according to claim 4, wherein:

each of the (p1×m1) bit processing units further includes a sign computation circuit configured to compute, when bit information corresponding to each column position in one of the rows of the parity-check matrix corresponding to said each bit processing unit is updated by said each bit processing unit, a product of signs of parity information values corresponding to all column positions in the one row of the parity-check matrix other than said each column position, bits at said each column position and said all column positions being set to "1"; and the sign of the bit information updated by said each bit processing unit is determined from the product of the signs of the parity information values computed by the sign computation circuit included in said each bit processing unit.

9. The irregular low-density parity-check code decoder according to claim 4, wherein each of the (p1×m1) bit-processing units further includes:

a first multiplexer which sequentially selects most significant bits of parity information values corresponding to column positions in a corresponding one of the rows of the parity-check matrix, a bit at each of the column positions being set to "1";

a first exclusive-OR circuit which performs exclusive-OR computation for calculating exclusive-ORs of the most significant bits of the parity information values sequentially selected by the first multiplexer;

a second multiplexer which sequentially selects most significant bits of parity information values corresponding to column positions in a corresponding one of the rows of the parity-check matrix, a bit at each of the column positions being set to "1"; and second exclusive-OR circuit which performs exclusive-OR computation on an exclusive-OR computation result of the first exclusive-OR circuit and a most significant bit selected by the second multiplexer, an exclusive-OR computation result of the second exclusive-OR circuit indicating the product of the signs of parity information values.

10. The irregular low-density parity-check code decoder according to claim 4, wherein whenever the subtraction circuit included in said each bit processing unit has finished subtractions for $\underline{m}$ column positions in the rows of the parity-check matrix, the controller causes the $\underline{m}$ parity processing units to execute parity update computation corresponding to $\underline{m}$ columns of one of the $\underline{s}$ column blocks to which the $\underline{m}$ column positions belong.

11. The irregular low-density parity-check code decoder according to claim 4, wherein:

said each bit processing unit includes a first lookup table configured to convert an output of the subtraction circuit into a value of a particular function for computing probability; and each of the p1 parity processing units includes a second lookup table provided at an output side thereof and configured to convert an updated parity information value into a value of the particular function.

12. The irregular low-density parity-check code decoder according to claim 4, wherein:

an array (m1×n1) of the (m1×n1) permuted matrices of the first parity-check matrix satisfies a condition that m1 is smaller than n1;

each of the p1 parity processing units simultaneously receives bit information corresponding to m1 row positions in a corresponding one of the p1 columns of each of the n1 column blocks, a bit at each of the m2 row positions being set to "1", and updates parity information corresponding to the m1 row positions, based on the bit information corresponding to the m1 row positions;

an array (m2×n2) of the (m2×n2) permuted matrices of the second parity-check matrix satisfies a condition that n2 is smaller than m2; and each of the p1 parity processing units simultaneously receives bit information corresponding to m2 row positions in a corresponding one of the p2 columns of each of the n2 column blocks, a bit at each of the m1 row positions being set to "1", and updates parity information corresponding to the m2 row positions, based on the bit information corresponding to the m2 row positions.

13. The irregular low-density parity-check code decoder according to claim 4, wherein:

said each bit processing unit includes a first lookup table configured to convert an output of the subtraction circuit into a value of a particular function for computing probability;

each of the p1 parity processing units includes a second lookup table provided at an output side thereof and configured to convert an updated parity information value into a value of the particular function;

an array (m1×n1) of the (m1×n1) permuted matrices of the first parity-check matrix satisfies a condition that m1 is smaller than n1;

each of the p1 parity processing units simultaneously receives bit information corresponding to m1 row positions in a corresponding one of the p1 columns of each of the n1 column blocks, a bit at each of the m1 row positions being set to "1", and updates parity information corresponding to the m1 row positions, based on the bit information corresponding to the m1 row positions;

an array (m2×n2) of the (m2×n2) permuted matrices of the second parity-check matrix satisfies a condition that n2 is smaller than m2; and each of the p1 parity processing units simultaneously receives bit information corresponding to m2 row positions in a corresponding one of the p2 columns of each of the n2 column blocks, a bit at each of the m1 row positions being set to "1", and updates parity information corresponding to the m2 row positions, based on the bit information corresponding to the m2 row positions.

14. In a decoder for ensuring message transmission integrity, a method of decoding an irregular low-density parity-check code with a first parity-check matrix including (m1×n1) first permuted matrices and being divided into n1 column blocks, and a second parity-check matrix arranged adjacent to the first parity-check matrix, including (m2×n2) second permuted matrices and being divided into n2 column blocks, each of the first permuted matrices being formed of an array of (p1×p1), and each of the second permuted matrices being formed of an array of (p2×p2), p1 being higher than p2, comprising:
- simultaneously executing, for respective rows of the first and second parity-check matrices, bit update computation for sequentially updating bit information corresponding to column positions included in the respective rows, a bit at each of the column positions being set to "1";
- simultaneously executing, in units of column blocks in the first parity-check matrix and the second parity-check matrix, parity update computation for sequentially updating parity information corresponding to row positions included in columns of the respective p1 and p2 column blocks of the first and second parity-check matrices, a bit at each of the row positions being set to "1";
- executing parity update computation corresponding to p1 columns of one of the n1 column blocks to which p1 column positions belong, whenever bit update computation for the p1 column positions in the respective rows of the first parity-check matrix is finished;
- starting next bit update computation when parity update computation corresponding to p1 columns of a first one of the n1 column blocks of the first parity-check matrix is finished;
- executing parity update computation corresponding to p2 columns of one of the n2 column blocks to which p2 column positions belong, whenever bit update computation for the p2 column positions in the respective rows of the second parity-check matrix is finished; and starting next bit update computation when parity update computation corresponding to p2 columns of a first one of the n2 column blocks of the second parity-check matrix is finished,
- wherein the decoded irregular low-density parity-check code is used to ensure message transmission integrity.

15. The method according to claim 14, wherein the simultaneously executing bit update computation includes:
- simultaneously executing, for respective rows of the first and second parity-check matrices, an addition process for sequentially adding up parity information values corresponding to column positions included in the respective rows, thereby computing a sum of the parity information values corresponding to each of the rows of the parity-check matrix, a bit at each of the column positions being set to "1"; and
- simultaneously executing, for respective rows of the first and second parity-check matrices, a subtraction process for sequentially subtracting the respective parity information values, used for the addition process, from the sum calculated for each row of the parity-check matrix.

16. The method according to claim 14, wherein:
the simultaneously executing bit update computation includes:
- simultaneously executing, for respective rows of the first and second parity-check matrices, an addition process for sequentially adding up parity information values corresponding to column positions included in the respective rows, thereby computing a sum of the parity information values corresponding to each of the rows of the first and second parity-check matrices, a bit at each of the column positions being set to "1";
- simultaneously executing, for respective rows of the first and second parity-check matrices, a subtraction process for sequentially subtracting the respective parity information values, used for the addition process, from the sum calculated for each row of the first and second parity-check matrices; and
- converting results of the subtraction process for each row of the first and second parity-check matrices into values of a particular function for probability computation, using a first lookup table provided for said each row, and
the simultaneously executing parity update computation includes converting an updated parity information value into a value of the particular function, using second lookup tables provided for the respective p1 columns of each column block of the first parity-check matrix, whenever a parity information value corresponding to each row position in the respective p1 columns of the first parity-check matrix is updated to the updated parity information value by parity update computation, the simultaneously executing parity update computation also including converting an updated parity information value into a value of the particular function, using second lookup tables provided for the respective p2 columns of each column block of the second parity-check matrix, whenever a parity information value corresponding to each row position in the respective p2 columns of the second parity-check matrix is updated to the updated parity information value by parity update computation.

17. The method according to claim 14, wherein:
an array (m1×n1) of the (m1×n1) first permuted matrices of the first parity-check matrix satisfies a condition that m1 is smaller than n1, and an array (m2×n2) of the (m2×n2) second permuted matrices of the second parity-check matrix satisfies a condition that n2 is smaller than m2; and
the simultaneously executing parity update computation includes:
simultaneously inputting bit information corresponding to m1 row positions in one of the p1 columns of each of the n1 column blocks of the first parity-check matrix, and simultaneously updating parity information values corresponding to the m1 row positions, based on the bit information corresponding to the m1 row positions, a bit at each of the m1 row positions being set to "1"; and
simultaneously inputting bit information corresponding to m2 row positions in one of the p2 columns of each of the n2 column blocks of the second parity-check matrix, and simultaneously updating parity information values corresponding to the m2 row positions, based on the bit information corresponding to the m2 row positions, a bit at each of the m2 row positions being set to "1".

* * * * *